(12) United States Patent
Gabara

(10) Patent No.: US 9,564,402 B2
(45) Date of Patent: Feb. 7, 2017

(54) METHOD AND APPARATUS FOR CREATING AND PLACING A MICRO MESSAGE

(71) Applicant: TrackThings LLC, Murray Hill, NJ (US)

(72) Inventor: Thaddeus John Gabara, Murray Hill, NJ (US)

(73) Assignee: TrackThings LLC, Murray Hill, NJ (US)

( * ) Notice: Subject to any disclaimer, the term of this patent is extended or adjusted under 35 U.S.C. 154(b) by 0 days.

(21) Appl. No.: 15/209,108

(22) Filed: Jul. 13, 2016

(65) Prior Publication Data

US 2016/0322309 A1    Nov. 3, 2016

Related U.S. Application Data

(63) Continuation-in-part of application No. 14/608,399, filed on Jan. 29, 2015.

(51) Int. Cl.
*H01L 21/00*    (2006.01)
*H01L 33/00*    (2010.01)
*H01L 23/544*   (2006.01)
*H01L 23/528*   (2006.01)

(52) U.S. Cl.
CPC ........... *H01L 23/544* (2013.01); *H01L 23/528* (2013.01); *H01L 2223/5442* (2013.01); *H01L 2223/54406* (2013.01)

(58) Field of Classification Search
CPC .................................................. H01L 23/544
USPC ................................... 438/22–30; 257/88–92
See application file for complete search history.

(56) References Cited

U.S. PATENT DOCUMENTS

2008/0198098 A1*  8/2008  Gelbman ............... G06F 3/147
                                                        345/59

\* cited by examiner

*Primary Examiner* — Calvin Lee
(74) *Attorney, Agent, or Firm* — Tyrean LLC

(57) ABSTRACT

Silicon processing technology is used to generate an array of micro messages. These micro messages can contain at least one stick figure, or at least one word, or at least one stick figure and at least one word, or at least one stick figure and a grid mark, or at least one word and a grid mark, or at least one stick figure and at least one word and a grid mark. Grid marks are associated with the micro message and used to identify the X and Y Cartesian coordinates of the message. A plurality of conductive traces is used to form the micro messages. Each micro message can be completely encapsulated in silicon dioxide or at least one conductive trace can be connected to one of the tubs.

20 Claims, 21 Drawing Sheets

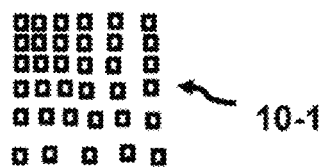
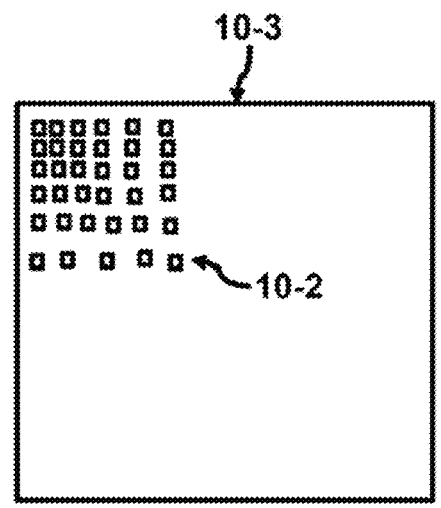
FIG. 10A
FIG. 10B
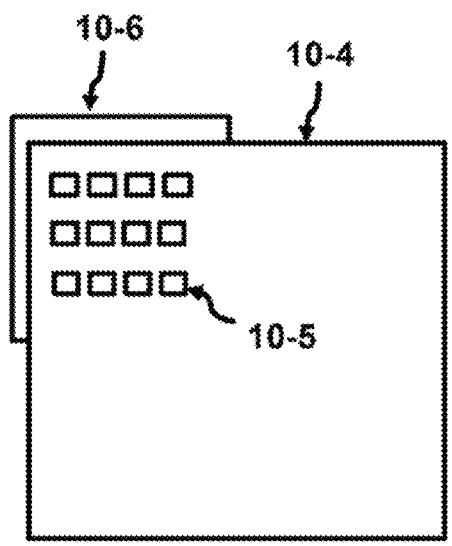
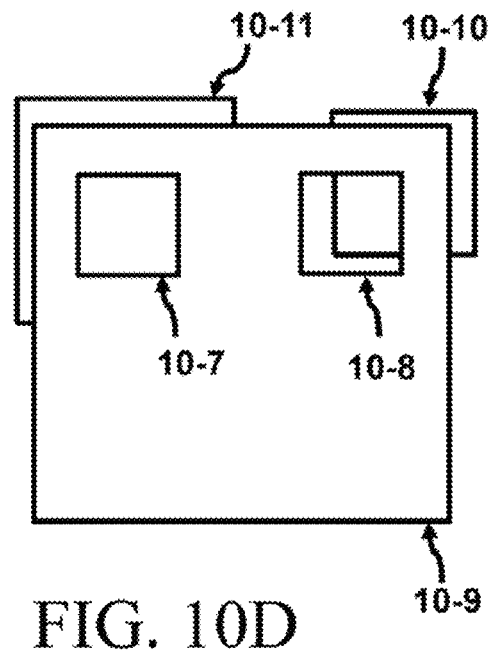
FIG. 10C
FIG. 10D

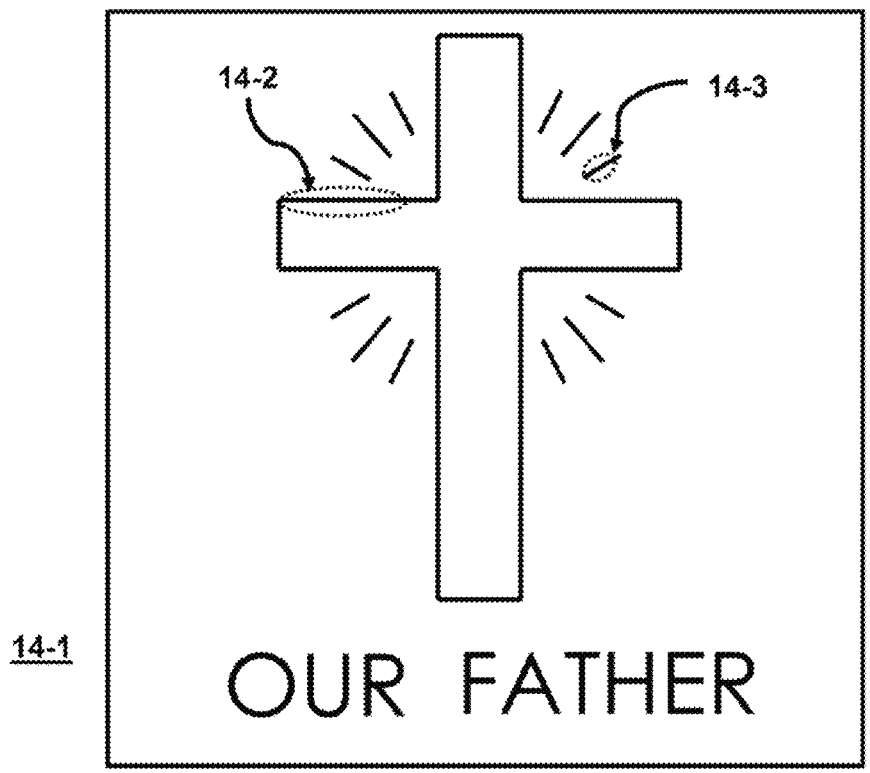
FIG. 14A
Our Father in heaven, hallowed be your name. Your kingdom come, your will be done, on earth as it is
Our Father in heaven, hallowed be your name. Your kingdom come, your will be done, on earth as it is
14-2
FIG. 14B
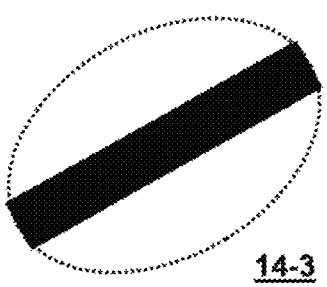
FIG. 14C

US 9,564,402 B2

METHOD AND APPARATUS FOR CREATING AND PLACING A MICRO MESSAGE

CROSS REFERENCE TO RELATED APPLICATIONS

The present application is a continuation in part of application Ser. No. 14/608,399, filed on Jan. 29, 2015, entitled "Method and Apparatus for Creating and Placing a Micro Message" which is invented by the same inventor as the present application and is incorporated herein by reference in their entireties.

BACKGROUND OF THE INVENTION

Messages are one of the fundamental focuses of mankind. They tell stories, educate, remember, form building blocks of knowledge, and have propelled mankind on the forward journey into the future. Message come in a variety of forms: art on a wall, carved in stone, cast in steel, printed on paper, and voiced in words. Messages are created to leave a mark on the senses and thought. Some messages are ephemeral until the sound disappears, other messages last thousands of years like the hieroglyphs and the Rosetta stone. Words live in folklore; physical messages express history.

Technology has helped to bring new methods of creating and storing messages possible. The telegraph, the telephone, radio, holography, electronic storage of sound, pictures, and video. Technology functioning for one purpose can be used to function as a medium to allow the creation and storage of messages in ways that can be novel and new. This disclosure reveals a method and apparatus to utilize an existing technology to provide a new and novel way of leaving messages written in materials that can last forever.

BRIEF SUMMARY OF THE INVENTION

This invention helps to overcome these shortcomings and offer several other advantages as well. Various embodiments and aspects of the inventions will be described with reference to details discussed below, and the accompanying drawings will illustrate the various embodiments. Some diagrams are not drawn to scale. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of the embodiments of the present inventions.

Silicon processing technology has been doubling the areal density of transistors into silicon every 2 years or so. In 1980, transistors were 3-5 microns in length where tens of thousands of transistor could fit into a single chip. Today, the transistors are hundreds of atoms in length where tens of billions of transistors can fit into a single chip. The width of metal lines to connect the transistors together is about the size of a HIV or Influenza virus. The size and structure of the devices in the silicon wafer technology has become so small that special equipment is required to fabricate them. These facilities are called fabrication lines or fabs, for short.

As the size of the transistor decreases, the cost of building the fabs has risen to astronomical proportions causing the companies build these fabs these to join forces to share the expensive costs of creating factories to fabricate these silicon wafers that hold these atomically sized transistors. This high cost in manufacturing facilities translates to high cost to process a chip design in the fab. This has created intermediary companies such a MOSIS to collect the designs of small startup companies and place all the designs of these small startup companies onto a single wafer so the high cost to process the chip design can be shared with the conglomeration of startup companies thereby allowing these startup companies to remain economically competitive in technology and budget.

One embodiment relates to an semiconductor chip comprising: a surface area of the semiconductor chip partitioned into a plurality of rectangles, wherein the plurality of rectangles are segregated into a plurality of first rectangles, a plurality of second rectangles, and a plurality of third rectangles; all sides of the first rectangles share a side with either another first rectangle or one of the plurality of second rectangles; at least two sides of the second rectangle shares a side with either another second rectangle or one of the plurality of first rectangles; and at least two sides of a third rectangle shares a side with one of the second rectangles; a plurality of micro messages and a plurality of conductive traces, wherein each micro message is formed from either a single conductive trace or a logical OR formed between two or more conductive traces; at least two of the plurality of rectangles each enclose at least one of the micro messages of the plurality of micro messages; and any two rectangles of the plurality of rectangles each enclosing at least one micro message and sharing a common side do not electrically connect any of the conductive traces between the two rectangles. The apparatus wherein the logical OR formed between any two conductive traces occupying the same layer and the same area electrically connect the two or more conductive traces, wherein the logical OR formed between any two conductive traces each occupying different layers electrically isolate the two or more conductive traces, wherein all micro messages are unique, wherein all rectangles have the same height dimensions and the same length dimensions, wherein the height dimension equals the length dimension.

Another embodiment relates to an semiconductor chip comprising: a surface area of the semiconductor chip partitioned into a plurality of rectangles, wherein the plurality of rectangles are segregated into a plurality of first rectangles, a plurality of second rectangles, and a plurality of third rectangles, all sides of the first rectangles share a side with either another first rectangle or one of the plurality of second rectangles; at least two sides of the second rectangle shares a side with either another second rectangle or one of the plurality of first rectangles; and at least two sides of a third rectangle shares a side with one of the second rectangles; a plurality of micro messages and a plurality of conductive traces, wherein each micro message is formed from either a single conductive trace or a logical OR formed between two or more conductive traces; at least two of the plurality of rectangles contain at least one of the micro messages of the plurality of micro messages; any two rectangles of the plurality of rectangles each containing at least one micro message and sharing a common side electrically connect a conductive trace from one rectangle to a conductive trace of the other rectangle, wherein all conductive traces either in singular form or electrically connected to another conductive trace within any micro message are encapsulated in an oxide, wherein the logical OR formed between any two conductive traces occupying the same layer and the same area electrically connect the two or more conductive traces, wherein the logical OR formed between any two conductive traces each occupying different layers electrically isolate the two or more conductive traces, wherein all micro messages are unique, wherein all rectangles have the same height dimensions and the same length dimensions, wherein the height dimension equals the length dimension.

Another embodiment relates to an semiconductor chip comprising: a surface area of the semiconductor chip partitioned into a plurality of rectangles, wherein the plurality of rectangles are segregated into a plurality of first rectangles, a plurality of second rectangles, and a plurality of third rectangles; all sides of the first rectangles share a side with either another first rectangle or one of the plurality of second rectangles; at least two sides of the second rectangle shares a side with either another second rectangle or one of the plurality of first rectangles; at least two sides of a third rectangle shares a side with one of the second rectangles; a plurality of stick figures formed by a placement of a first portion of a plurality of conductive traces to form each stick figure; a plurality of letters formed by a placement of a second portion of the plurality of conductive traces to form each letter; a plurality of numbers formed by a placement of a third portion of the plurality of conductive traces to form each number; a plurality of words formed by a placement of the plurality of letters; a plurality of grid marks formed by a placement of a pair of numbers to form each grid mark; a micro message comprising: at least one stick figure, or at least one word, or at least one stick figure and at least one word, or at least one stick figure and a grid mark, or at least one word and a grid mark, or at least one stick figure and at least one word and a grid mark; a first one of the rectangles contains a first micro message; and a second one of the rectangles contains a second micro message; wherein both the first micro message and the second micro message are encapsulated in oxide. The apparatus further comprising: a third one of the rectangles contains a third micro message; wherein one of the plurality of conductive traces of the third micro message is electrically connected to at least one tub of the semiconductor chip, wherein the third micro message is electronically isolated from the first and second micro message, wherein each stick figure, each letter, or each number is formed from either a single conductive trace or a logical OR formed between two or more conductive traces, wherein the logical OR formed between any two conductive traces each occupying different layers electrically isolate the two or more conductive traces, wherein all micro messages are unique, wherein all rectangles have the same height dimensions and the same length dimensions, wherein the height dimension equals the length dimension.

Another embodiment relates to an semiconductor chip comprising: a surface area of the semiconductor chip partitioned into a plurality of rectangles, wherein the plurality of rectangles are segregated into a plurality of first rectangles, a plurality of second rectangles, and a plurality of third rectangles; all sides of the first rectangles share a side with either another first rectangle or one of the plurality of second rectangles; at least two sides of the second rectangle shares a side with either another second rectangle or one of the plurality of first rectangles; and at least two sides of a third rectangle shares a side with one of the second rectangles; a plurality of micro messages and a plurality of conductive traces, wherein each micro message is formed from either a single conductive trace or a logical OR formed between two or more conductive traces; at least two of the plurality of rectangles each enclose at least one of the micro messages of the plurality of micro messages; any two rectangles of the plurality of rectangles each enclosing at least one micro message and sharing a common side do not electrically connect any of the conductive traces between the two rectangles; and one of the plurality of rectangles enclosing at least one micro message electrically connects at least one conductive trace to at least one tub of the semiconductor chip, wherein the logical OR formed between any two conductive traces occupying the same layer and the same area electrically connect the two or more conductive traces, wherein the logical OR formed between any two conductive traces each occupying different layers electrically isolate the two or more conductive traces, wherein all micro messages are unique, wherein all rectangles have the same height dimensions and the same length dimensions, wherein the height dimension equals the length dimension.

Another embodiment relates to an semiconductor chip comprising: a surface area of the semiconductor chip partitioned into a plurality of rectangles, wherein the plurality of rectangles are segregated into a plurality of first rectangles, a plurality of second rectangles, and a plurality of third rectangles; sides of the first rectangles share a side with either another first rectangle or one of the plurality of second rectangles; at least two sides of the second rectangle shares a side with either another second rectangle or one of the plurality of first rectangles; and at least two sides of a third rectangle shares a side with one of the second rectangles; a plurality of micro messages and a plurality of conductive traces, wherein each micro message is formed from either a single conductive trace or a logical OR formed between two or more conductive traces; at least two of the plurality of rectangles contain at least one of the micro messages of the plurality of micro messages; any two rectangles of the plurality of rectangles each containing at least one micro message and sharing a common side electrically connect a conductive trace from one rectangle to a conductive trace of the other rectangle, wherein all conductive traces either in singular form or electrically connected to another conductive trace within any micro message are enclosed by an insulator, wherein the logical OR formed between any two conductive traces occupying the same layer and the same area electrically connect the two or more conductive traces, wherein the logical OR formed between any two conductive traces each occupying different layers electrically isolate the two or more conductive traces, wherein all micro messages are unique, wherein all rectangles have the same height dimensions and the same length dimensions, wherein the height dimension equals the length dimension.

Another embodiment relates to an semiconductor chip comprising: surface area of the semiconductor chip partitioned into a plurality of rectangles, wherein the plurality of rectangles are segregated into a plurality of first rectangles, a plurality of second rectangles, and a plurality of third rectangles; all sides of the first rectangles share a side with either another first rectangle or one of the plurality of second rectangles; least two sides of the second rectangle shares a side with either another second rectangle or one of the plurality of first rectangles; and at least two sides of a third rectangle shares a side with one of the second rectangles; a plurality of micro messages and a plurality of conductive traces, wherein each micro message is formed from either a single conductive trace or a logical OR formed between two or more conductive traces; and at least two of the plurality of rectangles contain at least two of the micro messages of the plurality of micro messages, wherein the at least two micro messages correspond to the X and Y positions of a Cartesian coordinate system, respectively, wherein any two rectangles of the plurality of rectangles each containing at least two micro messages corresponding to the Y and X positions and sharing a common side have either a value of the X or a value of the Y equal.

Another embodiment relates to an semiconductor chip comprising: a surface area of the semiconductor chip partitioned into a plurality of rectangles, wherein the plurality of rectangles are segregated into a plurality of first rectangles, a plurality of second rectangles, and a plurality of third rectangles; all sides of the first rectangles share a side with either another first rectangle or one of the plurality of second rectangles; at least two sides of the second rectangle shares a side with either another second rectangle or one of the plurality of first rectangles; and at least two sides of a third rectangle shares a side with one of the second rectangles; a plurality of micro messages and a plurality of conductive traces, wherein each micro message is formed from either a single conductive trace or a logical OR formed between two or more conductive traces, wherein all conductive traces either in singular form or electrically connected to another conductive trace are enclosed by an insulator (the conductor in this case is floating or isolated from a potential voltage) and at least two of the plurality of rectangles contain at least two of the micro messages of the plurality of micro messages, wherein the at least two micro messages correspond to the X and Y positions of a Cartesian coordinate system, respectively, wherein any two rectangles of the plurality of rectangles each containing at least two micro messages corresponding to the Y and X positions and sharing a common side have either a value of the X or a value of the Y equal.

Another embodiment relates to an semiconductor chip comprising: a surface area of the semiconductor chip partitioned into a plurality of rectangles, wherein the plurality of rectangles are segregated into a plurality of first rectangles, a plurality of second rectangles, and a plurality of third rectangles; all sides of the first rectangles share a side with either another first rectangle or one of the plurality of second rectangles; at least two sides of the second rectangle shares a side with either another second rectangle or one of the plurality of first rectangles; at least two sides of a third rectangle shares a side with one of the second rectangles; a plurality of stick figures formed by a placement of a first portion of a plurality of conductive traces to form each stick figure; a plurality of numbers formed by a placement of a third portion of the plurality of conductive traces to form each number; plurality of grid marks formed by a placement of a pair of numbers to form each grid mark; a micro message comprising: at least one stick figure, or at least one stick figure and a grid mark; a first one of the rectangles contains a first micro message; and a second one of the rectangles contains a second micro message; wherein both the first micro message and the second micro message are encapsulated in oxide. The apparatus further comprising: a plurality of letters formed by a placement of a second portion of the plurality of conductive traces to form each letter; a plurality of words formed by a placement of the plurality of letters, wherein the micro message comprising: at least one word, or at least one stick figure and at least one word, or at least one word and a grid mark, or at least one stick figure and at least one word and a grid mark. The apparatus further comprising: a third one of the rectangles contains a third micro message; wherein one of the plurality of conductive traces of the third micro message is electrically connected to at least one tub of the semiconductor chip, wherein each stick figure, each letter, or each number is formed from either a single conductive trace or a logical OR formed between two or more conductive traces, wherein the logical OR formed between any two conductive traces each occupying different layers electrically isolate the two or more conductive traces, wherein all micro messages are unique, wherein all rectangles have the same height dimensions and the same length dimensions, wherein the height dimension equals the length dimension.

Another embodiment relates to a semiconductor chip comprising: a plurality of conductive polygons, wherein at least one side of each polygon is sized equal to or greater than a minimum sub-micron sized feature, wherein the semiconductor chip was processed in a silicon processing manufacturing facility that fabricates the minimum sub-micron sized feature; a placement of the plurality of conductive polygons over a surface of the semiconductor chip matching a corresponding gradient of a tone in an image that has been scaled in magnification, the image is visualized when viewed from the surface of the semiconductor chip when the plurality of conductive polygons blend in a continuous tone.

Another embodiment relates to a semiconductor chip comprising: a plurality of conductive polygons, wherein at least one side of each polygon is sized equal to or greater than a minimum sub-micron sized feature, wherein the semiconductor chip was processed in a silicon processing manufacturing facility that fabricates the minimum sub-micron sized feature; a placement of the plurality of conductive polygons over a surface of the semiconductor chip matching a corresponding gradient of a tone in an image that has been scaled in magnification, wherein the matching occurs by adjusting the spacing between the placement of the plurality of conductive polygons over a surface of the semiconductor chip; wherein the image is visualized when viewed from the surface of the semiconductor chip when the plurality of conductive polygons blend in a continuous tone.

Another embodiment relates to a semiconductor chip comprising: a plurality of conductive polygons, wherein at least one side of each polygon is sized equal to or greater than a minimum sub-micron sized feature, wherein the semiconductor chip was processed in a silicon processing manufacturing facility that fabricates the minimum sub-micron sized feature; a uniform placement of the plurality of conductive polygons over a surface of the semiconductor chip matching a corresponding gradient of a tone in an image that has been scaled in magnification, wherein the matching occurs by adjusting the cross sectional dimension of the plurality of conductive polygons over a surface of the semiconductor chip; wherein the image is visualized when viewed from the surface of the semiconductor chip when the plurality of conductive polygons blend in a continuous tone.

Another embodiment relates to a semiconductor chip comprising: a plurality of conductive polygons, wherein at least one side of each polygon is sized equal to or greater than a minimum sub-micron sized feature, wherein the semiconductor chip was processed in a silicon processing manufacturing facility that fabricates the minimum sub-micron sized feature; a placement of the plurality of conductive polygons over a surface of the semiconductor chip matching a corresponding gradient of a tone in an image, wherein the matching occurs by either adjusting the cross sectional dimension of the plurality of conductive polygons over a surface of the semiconductor chip, adjusting the spacing between the placement of the plurality of conductive polygons over a surface of the semiconductor chip or both; wherein the image is visualized when viewed from the surface of the semiconductor chip when the plurality of conductive polygons blend in a continuous tone.

Another embodiment relates to a semiconductor chip comprising: a plurality of conductive polygons, wherein at least one side of each polygon is sized equal to or greater than a minimum sub-micron sized feature, wherein the semiconductor chip was processed in a silicon processing manufacturing facility that fabricates the minimum sub-micron sized feature; a placement of the plurality of conductive polygons over a surface of the semiconductor chip matching a corresponding gradient of a tone in an image, the image is visualized when viewed from the surface of the semiconductor chip when the plurality of conductive polygons blend in a continuous tone.

Another embodiment relates to a semiconductor chip comprising: a plurality of conductive polygons, wherein at least one side of each polygon is sized equal to or greater than a minimum sub-micron sized feature, wherein the semiconductor chip was processed in a silicon processing manufacturing facility that fabricates the minimum sub-micron sized feature; a placement of the plurality of conductive polygons over a surface of the semiconductor chip matching a corresponding gradient of a tone in an image, wherein the matching occurs by adjusting the spacing between the placement of the plurality of conductive polygons over a surface of the semiconductor chip; wherein the image is visualized when viewed from the surface of the semiconductor chip when the plurality of conductive polygons blend in a continuous tone.

Another embodiment relates to a semiconductor chip comprising: a plurality of conductive polygons, wherein at least one side of each polygon is sized equal to or greater than a minimum sub-micron sized feature, wherein the semiconductor chip was processed in a silicon processing manufacturing facility that fabricates the minimum sub-micron sized feature; a uniform placement of the plurality of conductive polygons over a surface of the semiconductor chip matching a corresponding gradient of a tone in an image, wherein the matching occurs by adjusting the cross sectional dimension of the plurality of conductive polygons over a surface of the semiconductor chip; wherein the image is visualized when viewed from the surface of the semiconductor chip when the plurality of conductive polygons blend in a continuous tone.

Another embodiment relates to a semiconductor chip comprising: a plurality of conductive polygons, wherein at least one side of each polygon is sized equal to or greater than a minimum sub-micron sized feature, wherein the semiconductor chip was processed in a silicon processing manufacturing facility that fabricates the minimum sub-micron sized feature; a placement of the plurality of conductive polygons over a surface of the semiconductor chip matching a corresponding gradient of a tone in an image, wherein the matching occurs by either adjusting the cross sectional dimension of the plurality of conductive polygons over a surface of the semiconductor chip, adjusting the spacing between the placement of the plurality of conductive polygons over a surface of the semiconductor chip or both; wherein the image is visualized when viewed from the surface of the semiconductor chip when the plurality of conductive polygons blend in a continuous tone.

Another embodiment relates to an semiconductor chip comprising: a surface area of the semiconductor chip partitioned into a plurality of rectangles, wherein the plurality of rectangles are segregated into a plurality of first rectangles, a plurality of second rectangles, and a plurality of third rectangles; all sides of the first rectangles share a side with either another first rectangle or one of the plurality of second rectangles; at least two sides of the second rectangle shares a side with either another second rectangle or one of the plurality of first rectangles; and at least two sides of a third rectangle shares a side with one of the second rectangles; a plurality of micro messages and a plurality of conductive traces, wherein each micro message is formed from either a single conductive trace or a logical OR formed between two or more conductive traces; at least two of the plurality of rectangles contain at least one of the micro messages of the plurality of micro messages, wherein at least one conductive trace either in singular form or electrically connected to another conductive traces within any micro message is encapsulated in an oxide except for a via connecting the at least one conductive trace to a common node.

Another embodiment relates to an semiconductor chip comprising: a surface area of the semiconductor chip partitioned into a plurality of rectangles, wherein the plurality of rectangles are segregated into a plurality of first rectangles, a plurality of second rectangles, and a plurality of third rectangles; all sides of the first rectangles share a side with either another first rectangle or one of the plurality of second rectangles; at least two sides of the second rectangle shares a side with either another second rectangle or one of the plurality of first rectangles; and at least two sides of a third rectangle shares a side with one of the second rectangles; a plurality of micro messages and a plurality of conductive traces, wherein each micro message is formed from either a single conductive trace or a logical OR formed between two or more conductive traces; at least two of the plurality of rectangles contain at least one of the micro messages of the plurality of micro messages; any two rectangles of the plurality of rectangles each containing at least one micro message and sharing a common side electrically connect a conductive trace from one rectangle to a conductive trace of the other rectangle, wherein the conductive trace from one rectangle to the conductive trace of the other rectangle is encapsulated in an oxide except for a via connecting either one of the conductive traces to a common node.

The polygons can have a variety of shapes. For example, the polygons can be triangles, quadrilaterals, pentagons, hexagons, heptagons, or octagons. The triangles can be further divided into equilateral, isosceles, obtuse, acute, or scalene. The quadrilaterals can be rectangles, rhombi, trapezoids, or squares.

BRIEF DESCRIPTION OF THE DRAWINGS

Please note that the drawings shown in this specification may not necessarily be drawn to scale and the relative dimensions of various elements in the diagrams are depicted schematically. The inventions presented here may be embodied in many different forms and should not be construed as limited to the embodiments set forth herein. Rather, these embodiments are provided so that this disclosure will be through and complete, and will fully convey the scope of the invention to those skilled in the art. In other instances, well-known structures and functions have not been shown or described in detail to avoid unnecessarily obscuring the description of the embodiment of the invention.

FIG. 10A presents a top view of conductive polygons that are positioned in distance over a gradient in one embodiment in accordance with the present invention.

FIG. 10B shows a top view of a metal layer with polygon opening that are positioned in distance over a gradient altering the effective brightness, tone of the top surface from a distance in one embodiment in accordance with the present invention.

FIG. 10C presents a top view of a metal layer with small opening exposing a different surface layer underneath altering the effective brightness, tone of the top surface from a distance in one embodiment in accordance with the present invention.

FIG. 10D presents a top view of a metal layer with two openings exposing different proportions of a surface layer underneath altering the effective brightness, tone of the top surface from a distance in one embodiment in accordance with the present invention.

FIG. 14A presents an image formed using stick figures and text to form a cross on a 4 mm×4 mm semiconductor chip in accordance with the present invention.

FIG. 14B presents a magnified view of the line formed from at least one row of text in one embodiment in accordance with the present invention.

FIG. 14C shows a magnified view of the line (as used in FIG. 9B) formed from a conductive polygon in one embodiment in accordance with the present invention.

DETAILED DESCRIPTION OF THE INVENTION

Figure 1A:
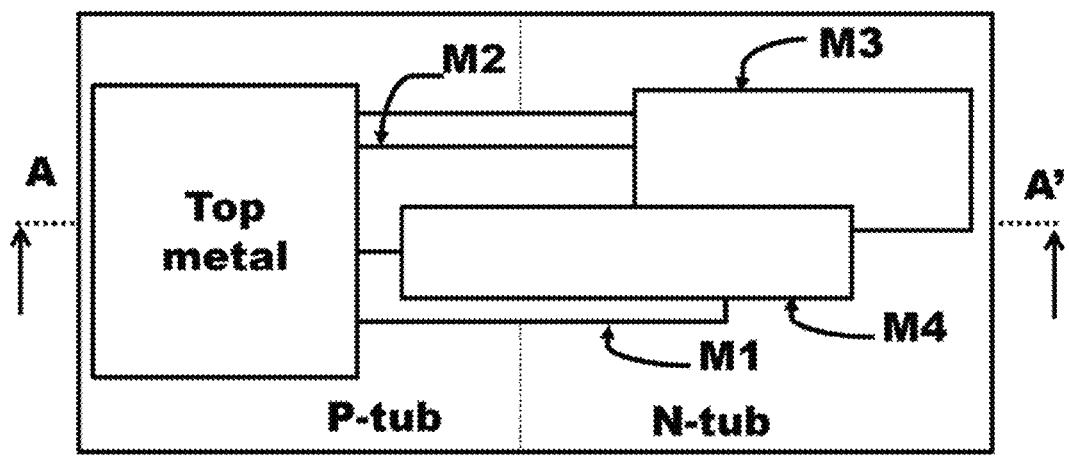
FIG. 1A is a top perspective view of a portion of a semiconductor wafer presenting several layers of metal.

FIG. 1A illustrates a top view of a portion of a silicon wafer. The wafer has N-tub and P-tub doped regions in the substrate. The tubs typically have heavily doped p+ and n+ regions which are used to form tub ties, and define the source/drain regions of a transistor. If the starting substrate is p+, the N-tub can be patterned to form a conductor region. Furthermore, a heavily doped p+ region in an N-tub can be patterned to form another conductor region. Layers of oxide cover the substrate wherein between the layers of oxide, conductive traces are defined. These conductive traces could be formed from materials such as poly-silicon, aluminum, copper, etc. and can conduct electricity. The oxide, typically silicon dioxide but can be silicon nitride, is a non-conductor or insulator and does not conduct electricity. Two adjacent but not touching conductive traces are not electrically connected since an oxide separates the two conductive traces.

These conductive traces are usually used to form circuits with the transistor and other components: capacitors, inductors, or resistors in the substrate. FIG. 1A illustrates several conductive traces located in different metal layers ranging from M1, M2, M3, M4 and a top metal layer progressively proceeding from the surface of the substrate and up. Various flavors of silicon processes allow the formation of a different numbers of metal layers. Each metal layer can have a plurality of conductive traces. All of these metal layers are sandwiched between oxide layers. Vias are used to interconnect the metal within one conductive trace in one layer to that of a conductive trace in another layer. They can connect a metal layer to either the metal layer above, the metal layer below or both. It is possible to have conductive traces formed in the metal layers that are "islands" which can be completely encapsulated in oxide by not using the vias. These islands would be completely enclosed by an insulator; therefore, these conductive trace segments would not conduct electricity since the oxide surrounding them prevents the formation of a closed electronic circuit to be established.

Figure 1B:
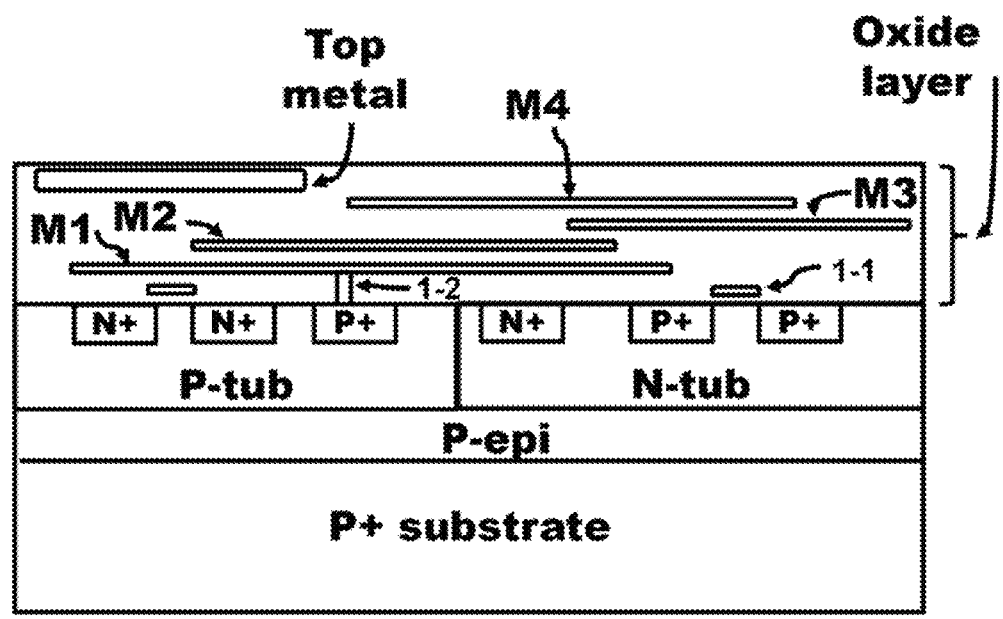
FIG. 1B is a side perspective view of a portion of a semiconductor wafer presenting several layers of metal.

FIG. 1B illustrates a side view of the portion of the silicon wafer presented in FIG. 1A. The poly-silicon 1-1, M2, M3, M4 and top metal layers of the metal segments presented in FIG. 1A and FIG. 1B are encapsulated with oxide and are "islands" as mentioned earlier. The conductive trace at the M1 layer is electrically connected to the P-tub by the via 1-2. The P+ substrate would act as a common node to the M1 conductive trace layer. The M conductive trace would not carry current continuously when connected to the common node since a complete closed electrical circuit does not exist. The M1 conductive trace would be considered an open circuit. The M2 conductive trace would be considered a floating node since this trace is completely surrounded by oxide. The wafer has a P+ substrate, followed by a layer of P-epi which can be grown epitaxially. The P-epi is doped to form the P-tub and N-tub regions. Then, each of the tubs are further doped to form the N+ and P+ heavily doped regions. Then, a first layer of oxide is grown. Poly silicon 1-1 is used to define the gates of the transistors. The poly-silicon also uses vias to connect to the substrate or to a metal layers above. The metal layers are segregated from one another by a layer of oxide. Since only one via is used to connect M1 in FIG. 1A or FIG. 1B, the poly-silicon, M2, M3, M4, and Top metal traces are each completely encapsulated in oxide. The poly-silicon, M2, M3, M4, and Top metal are conductive traces. They all have the ability to conduct electricity but because vias have not been used and the metal are patterned into small segments, the oxide layers surrounding each of the metal segments isolates all the conductive traces from each other. Thus, each of the conductive traces encapsulated by an oxide encloses the conductive traces by an insulator preventing the conduction of electricity between any of the conductive traces. Thus, these conductive traces are insulated from one another.

Figure 2A:
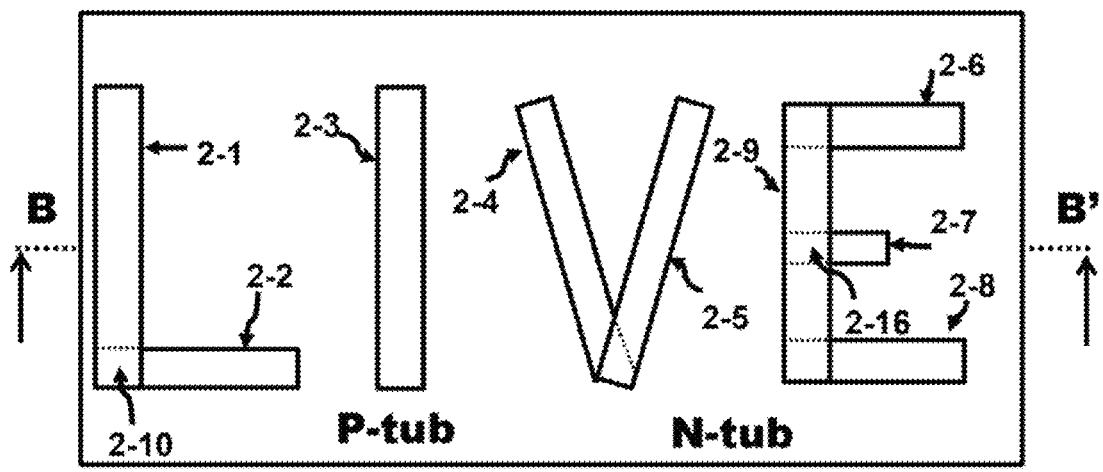
FIG. 2A is a top view of two different layers of metal used to create letters to form a word in accordance with the present invention.
Figure 2B:
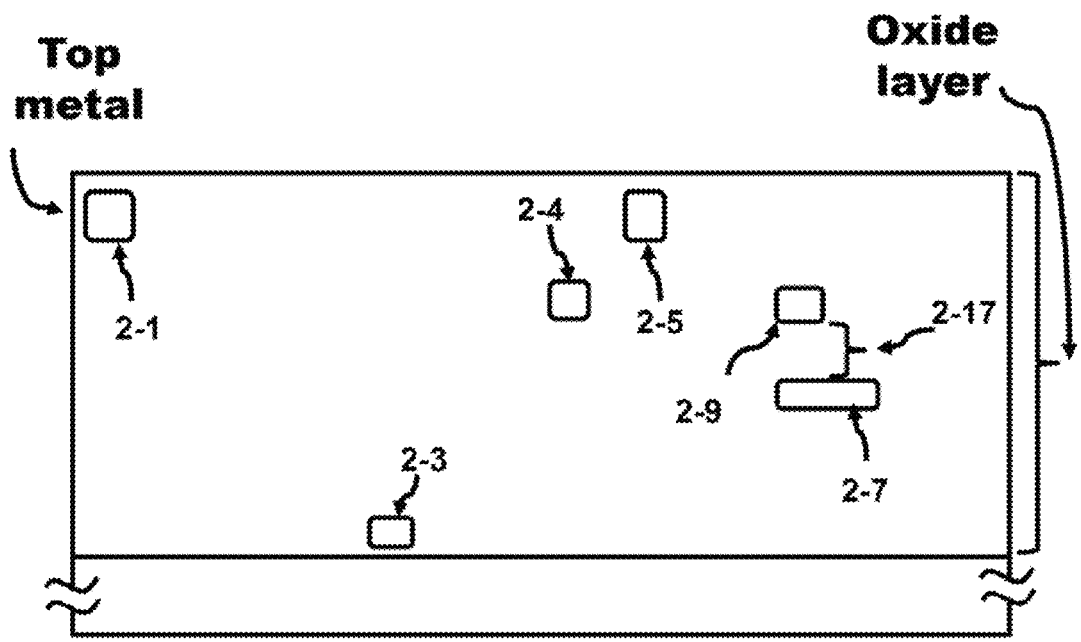
FIG. 2B is a side view FIG. 2A where two different layers of metal are used to create letters to form a word.

FIG. 2A and FIG. 2B illustrates how conductive traces can be used to form text when the micro message is viewed from the top surface of the chip or die. Top metal is used to define the conductive traces 2-1 and 2-5. M4 is used to define the conductive traces 2-4 and 2-9. M3 is used to define the conductive traces 2-6, 2-7 and 2-8. M2 is used to define the conductive trace 2-2. Poly-silicon is used to define the conductive trace 2-2.

Note that the letter "L" is formed by the Boolean OR of the area of conductive trace 2-1 formed in the top metal layer with the area of the conductive trace 2-2 which is formed in the poly-silicon layer. The two areas overlap 2-10 but the Boolean OR operation visually combines these top metal and poly-silicon layers displaying only the top layer portion. Also, when the micro message is viewed from the top surface of the chip, these two conductive traces are superimposed in the overlap region 2-10 and the upper conductive trace blocks the lower conductive trace from being seem. Similarly, the letter "V" is formed by the Boolean OR of the area of conductive trace 2-4 formed in the M4 layer with the area of the conductive trace 2-5 formed with the top metal layer. There is an overlap in the area near the bottom of the "V". The letter "E" is formed by the Boolean OR of the area of conductive trace 2-9 formed in the M4 layer with the area of the conductive traces 2-6, 2-7, and 2-8 formed with M3 layer. The middle left area of the letter "E" 2-16 shows the overlap area of 2-9 over the same area portion of 2-7. The Boolean OR visually combines these M4 and M3 layers even though there is a layer of oxide 2-17 between these two conductive traces.

The cross-sectional view in FIG. 2B shows the word "LIVE" cut across the dotted line BB'. This diagram displays the vertical displacement between the conductive traces, where the numerical numbers are common with the earlier diagram. These metal layers, when viewed from the top surface of the chip, display the word "LIVE".

Figure 3A:
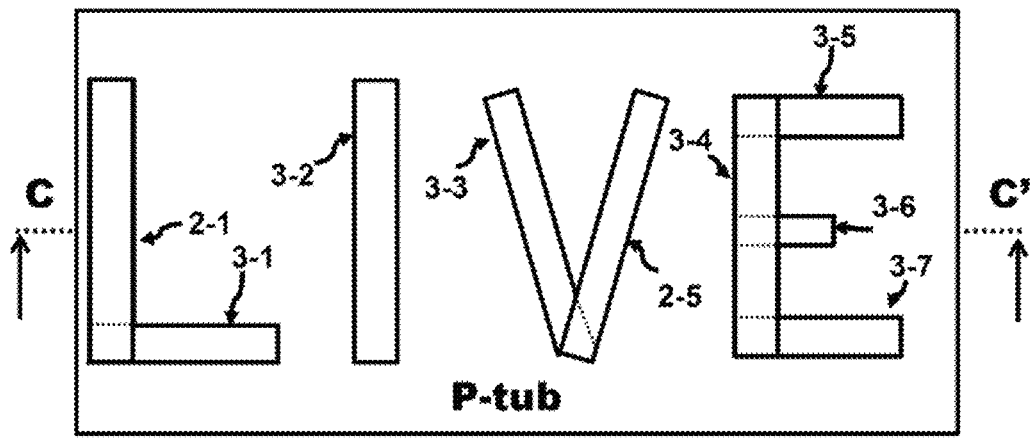
FIG. 3A depicts the top view of single layer of metal used to create letters to form a word.
Figure 3B:
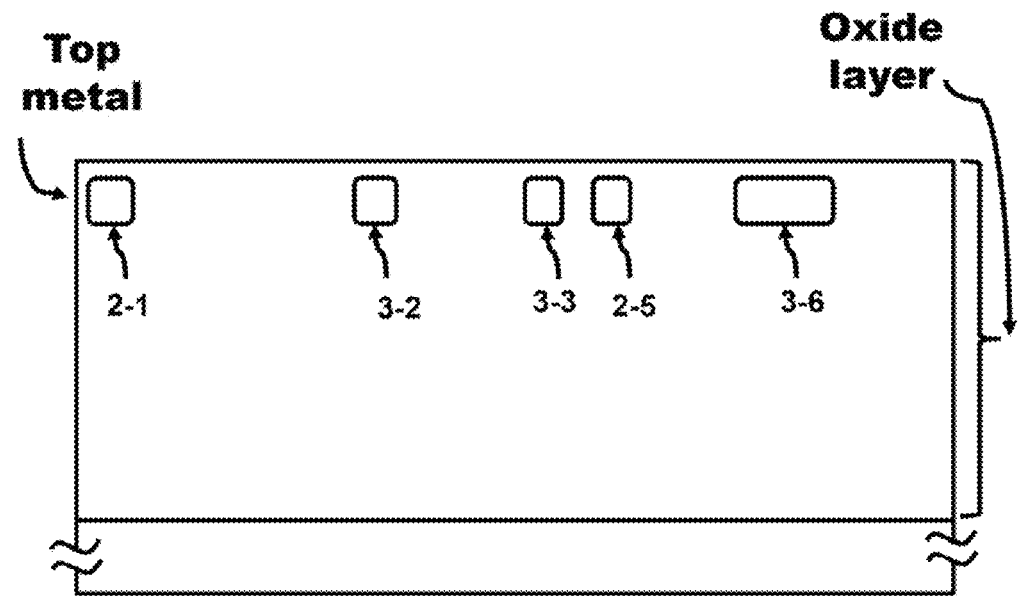
FIG. 3B shows a side view of single layer of metal used to create letters to form a word in FIG. 3A.

FIG. 3A and FIG. 3B illustrates how conductive traces formed on the same metal layer can be used to form text. In FIG. 3A, the top metal is used to define the conductive traces 2-1, 2-5, and 3-1 through 3-7. Each of the letters is formed by one or more conductive trace segments. When the segments superimpose over one another, as in the letters "L", "V", and "E", the Boolean OR combines the common area into a single conductive trace. The cross-sectional view in FIG. 3B shows the word "LIVE" cut across the dotted line CC'. Note that the letter "V" is cut twice, showing the cross sectional cuts of 3-3 and 2-5. The remaining cross sectional cuts correspond to the numbering provided in FIG. 3A. FIG. 3 only uses the top metal layer to form the word "LIVE". Any metal layer can be used to form the words; typically, the layers closer to the surface of the substrate have smaller minimum widths.

Figure 4A:
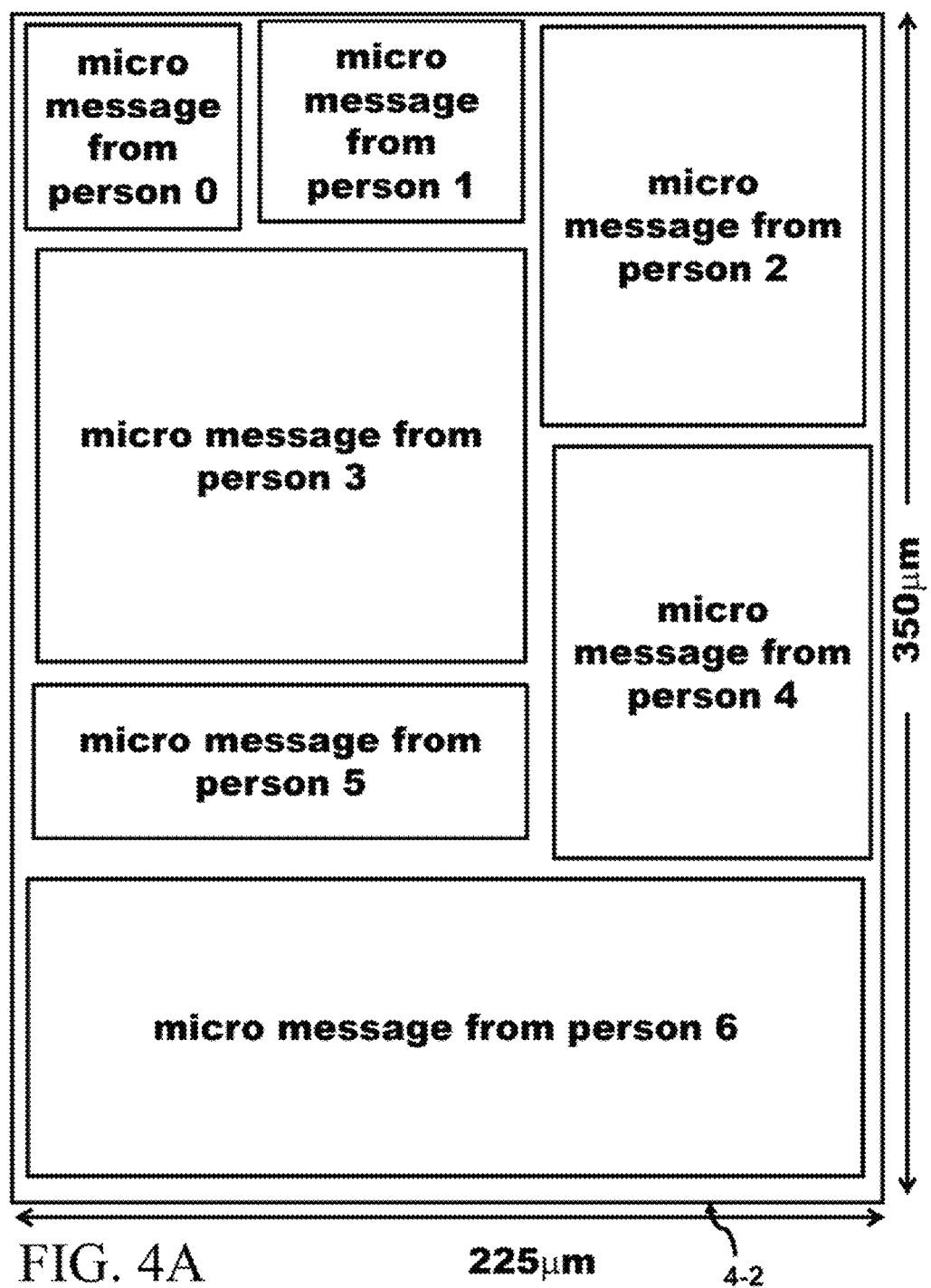
FIG. 4A illustrates a top view highlighting the boundaries of messages from different people of one embodiment in accordance with the present invention.
Figure 4B:
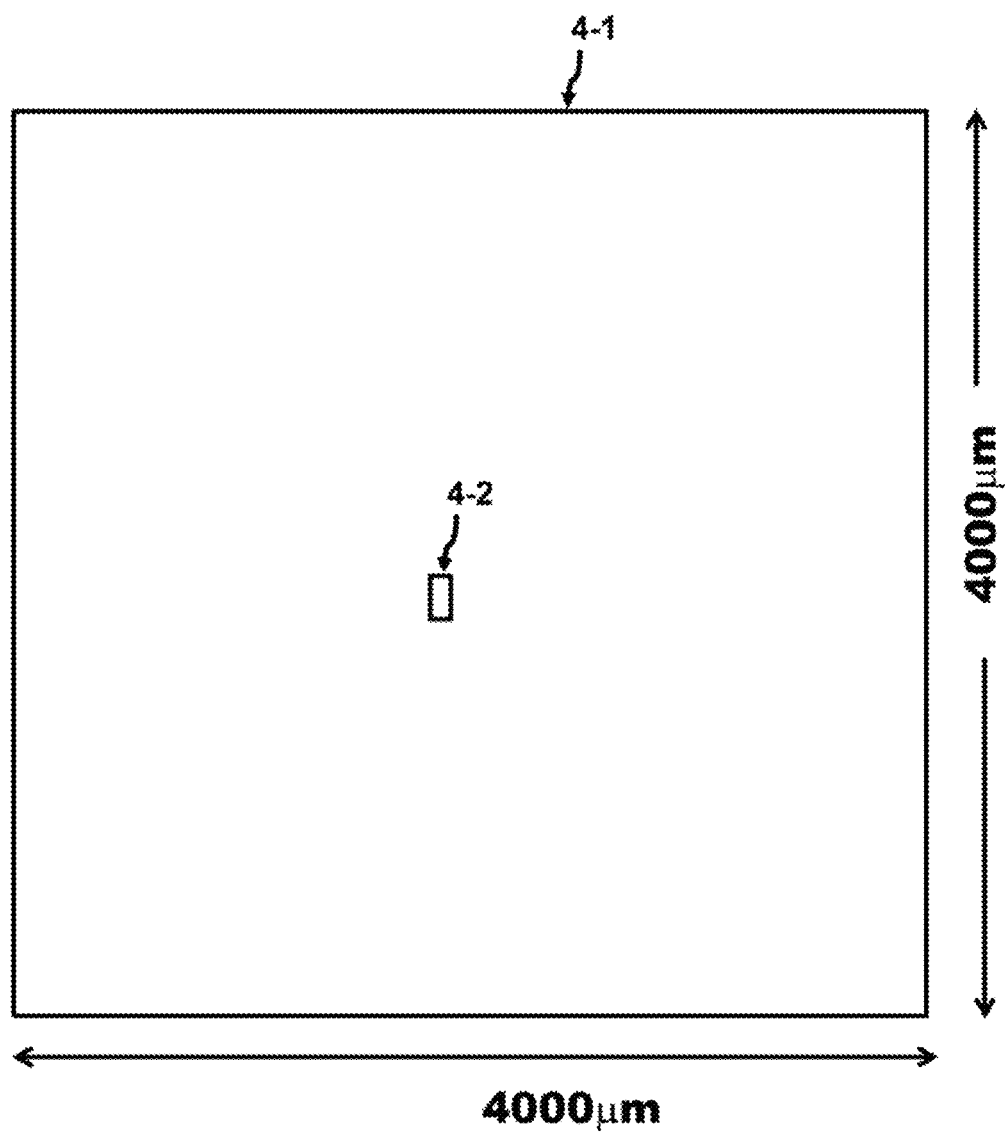
FIG. 4B presents a top view of a semiconductor chip with the location of the micro messages from different people in FIG. 4A in one embodiment in accordance with the present invention.

FIG. 4A illustrates a top view of a rectangular area 225 um by 350 um of the silicon wafer surface area which is partitioned to hold the micro messages of person 0 through person 6. In this case, each micro message has a different area and is pasted together to form the larger rectangular area 4-2. FIG. 4B illustrates the top view of a chip 4-1 sized 4000 um×4000 um on the wafer. The size of the chip can be varied to other sizes as desired. The rectangular area 4-4 presented in FIG. 4A is shown. It would be difficult to find the rectangular area 4-2 within the larger area of the chip 4-1 since the exact location of area 4-2 has not been marked. Searching for the area 4-2 under a microscope would be challenging since there are no guide posts. Furthermore, once the area 4-2 is found, then the next step would be to locate one of the persons 0-6 within the rectangular area 4-2.

Figure 5A:
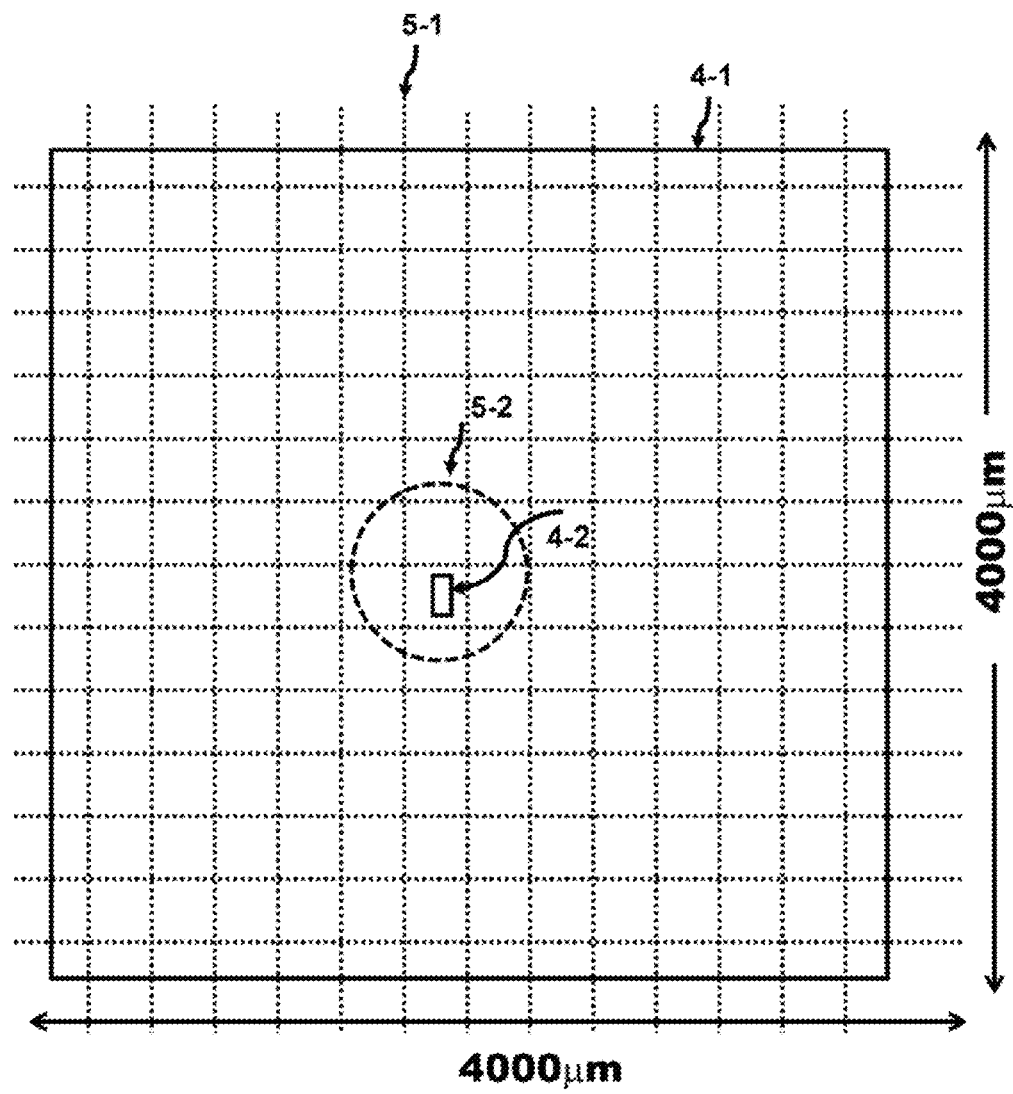
FIG. 5A illustrates a top up view highlighting the Cartesian numbering of the grid system of one embodiment in accordance with the present invention.

FIG. 5A illustrates the same view as provided in FIG. 4B with the addition of a Cartesian coordinate grid dotted line 5-1 system added to the view. The actual dotted grid lines can be drawn onto the surface of the chip, if desired. The grid lines need a way of being represented onto the surface of the silicon so that the circled region 5-2 within a particular grid can be found easily and quickly.

Figure 5B:
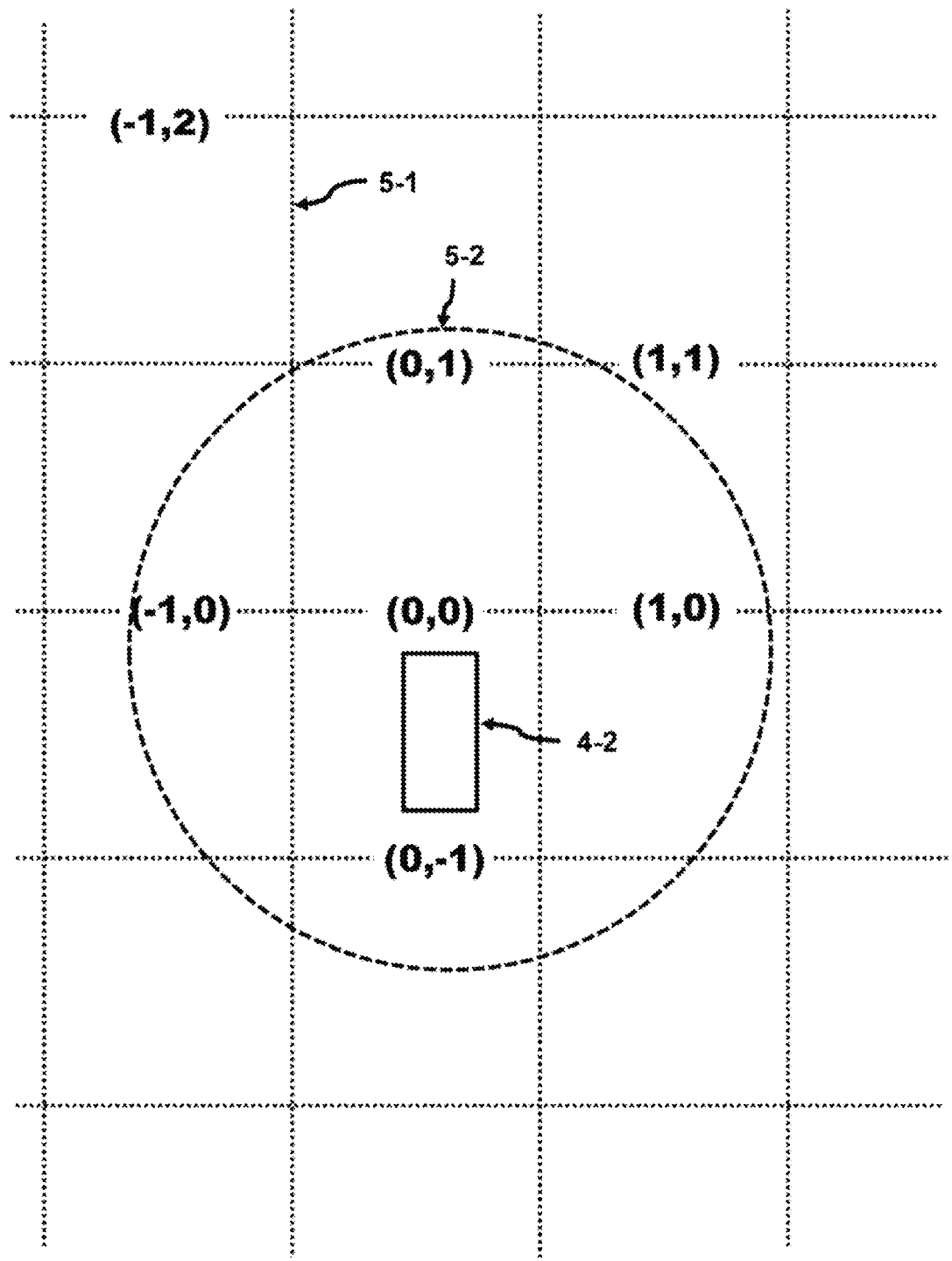
FIG. 5B illustrates a top close up view of FIG. 5A highlighting the Cartesian numbering of the grid system of one embodiment in accordance with the present invention.

FIG. 5B illustrates a marking to identify the areas within the grid 5-1. The circled region 5-2 identifies some of the symbols used to identify the Cartesian coordinates associated with the grid dotted lines 5-1. Along the middle of each horizontal grid line, a grid mark is formed using conductive traces to form the physical structure: "(location X, location Y)." The grid mark is placed and positioned unto the surface of the chip. The location X represents the "X" coordinate while location Y represents the "Y" coordinate. Each of the "X" and "Y" values can be replaced with the numerical symbols corresponding to the actual Cartesian coordinate that is being specified. Thus, the Cartesian coordinate for rectangular area 4-2 is marked as (0, 0). Once one grid mark is labelled, all remaining grid marks can be labelled accordingly. The area adjacent to the right is (1,0), the area adjacent to the left is (−1, 0). Placing these grid marks regularly helps identifying the location of any location within the chip quickly. These grid marks also help locate the area when viewed under a microscope since these grid marks can be used to provide bearing when the chip is being viewed under magnification.

One of the difficulties of the partitioning of the different people using the surface area in FIG. 4A is that the individual component areas are not uniform. The grid marks can be used to help locate a particular area, then the next step is to find that one particular micro message associated with that one person out of several.

Figure 6A:
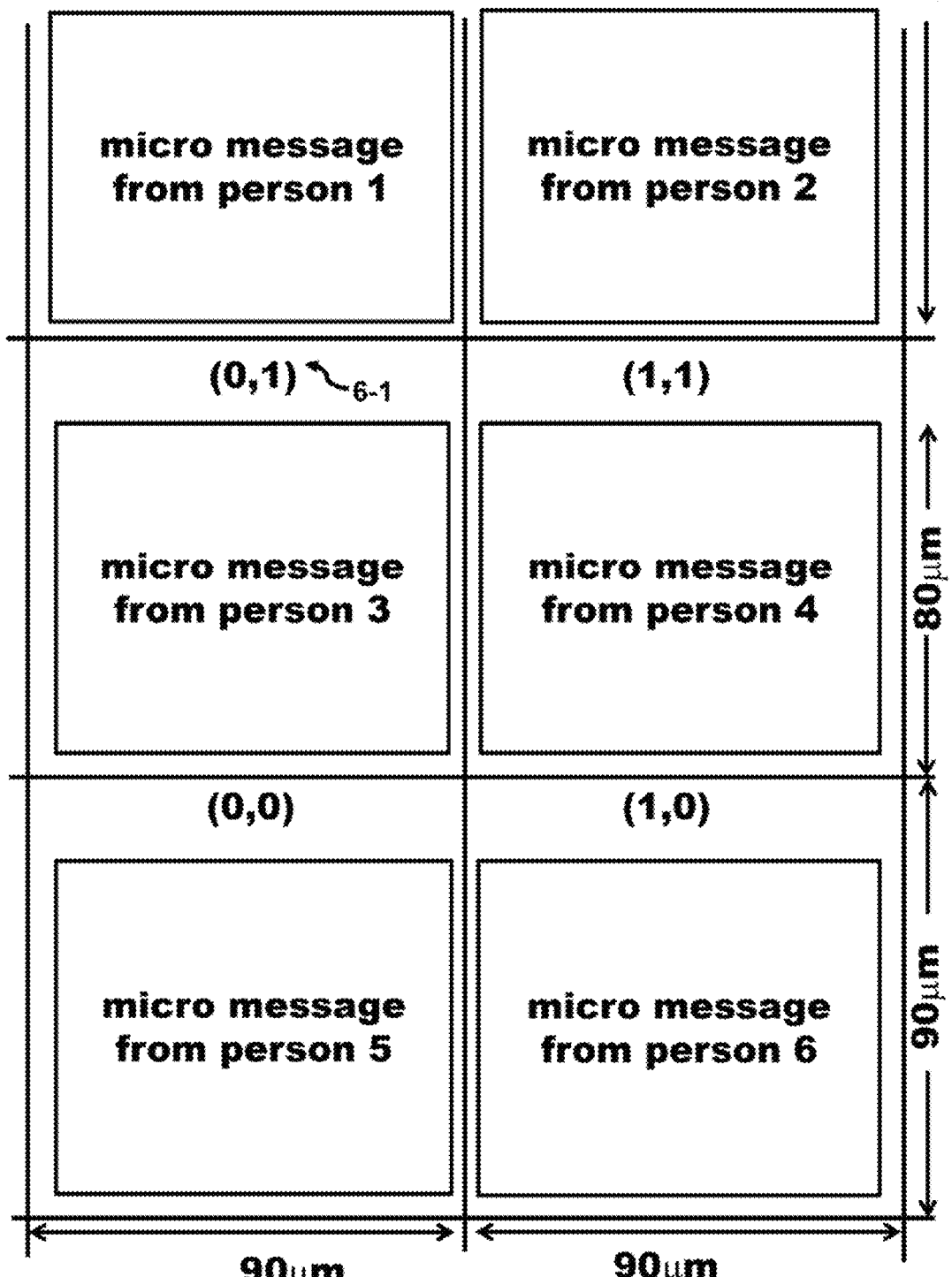
FIG. 6A depicts the top view of a semiconductor chip partitioned into equal components for each different person of one embodiment in accordance with the present invention.

FIG. 6A simplifies the Cartesian coordinate system by providing an area that is uniform across the entire coordinate system and assigning that area associated with a grid mark to a single person. As illustrated in FIG. 6A, the assigned area is 90 um×90 um but is not limited to this size. There are 6 equal areas, and each is filled by a different person ranging from person 1 to person 6, each person providing a different micro message. The micro message of the person is located in the area of 90 um×80 um while the remaining upper area of 90 um×10 um is marked with the grid mark containing location X and location Y providing the Cartesian coordinate. Now, each person is assigned a uniform area, and each area is marked with a grid mark to identify its location.

Figure 6B:
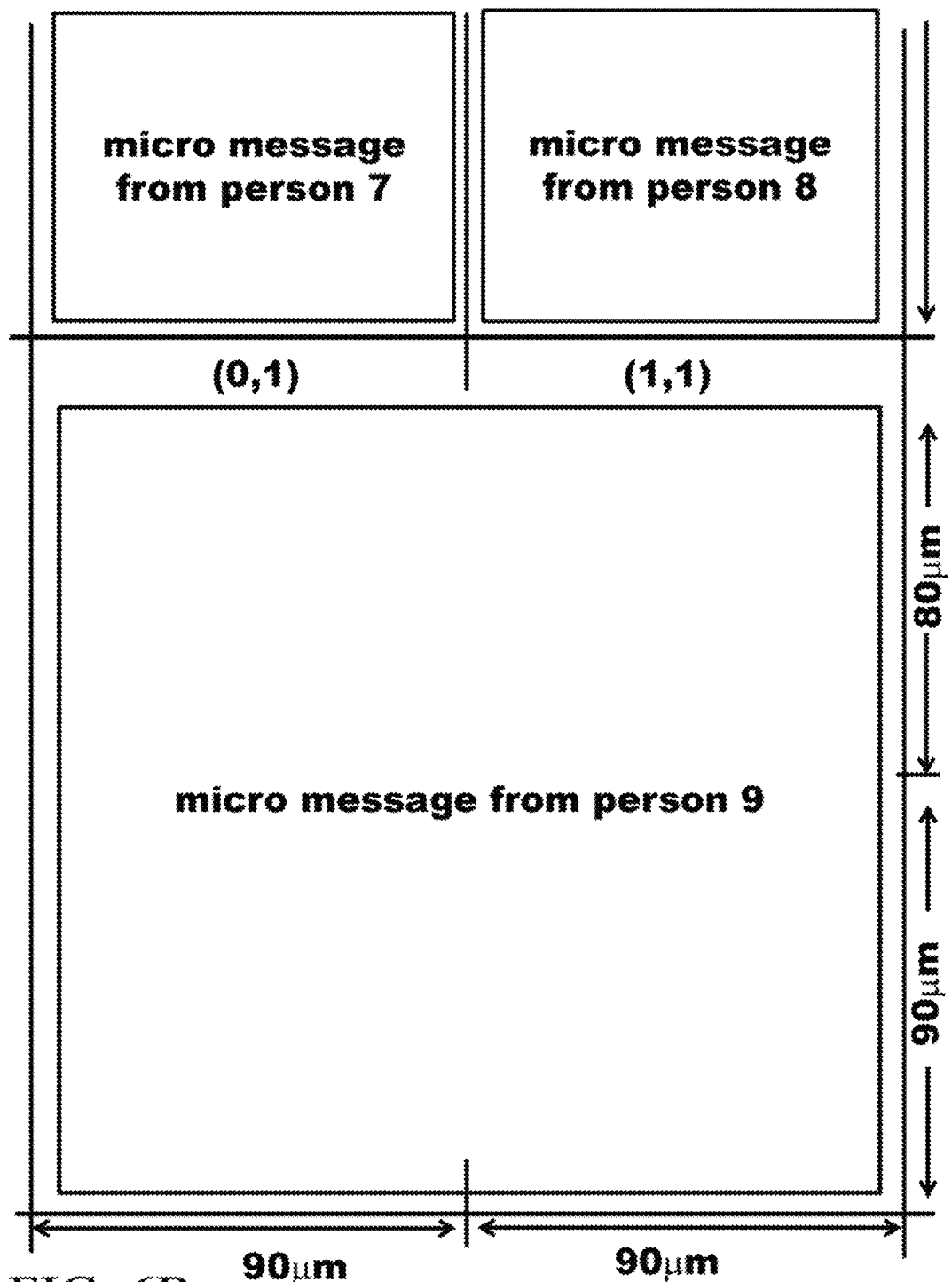
FIG. 6B shows the top view of the semiconductor chip partitioned into integer/integer multiples of surface area of one embodiment in accordance with the present invention.

An advantage of this system is that is illustrated in FIG. 6B. Person 7 and 8 occupy the minimum area. However, a person can request a larger area by combining several adjacent areas together. The person 9 has a micro message that extends over four of the minimum sized areas. Note that the grid marks in the center of the area (0,0) and (1,0) have been removed. Joining together areas increases the usable space for the micro message. This freed up area can be used by person 9 to increase the area for their micro message. Person 9 can locate their area by looking for grid mark (0,1) or (1,1).

Figure 7A:
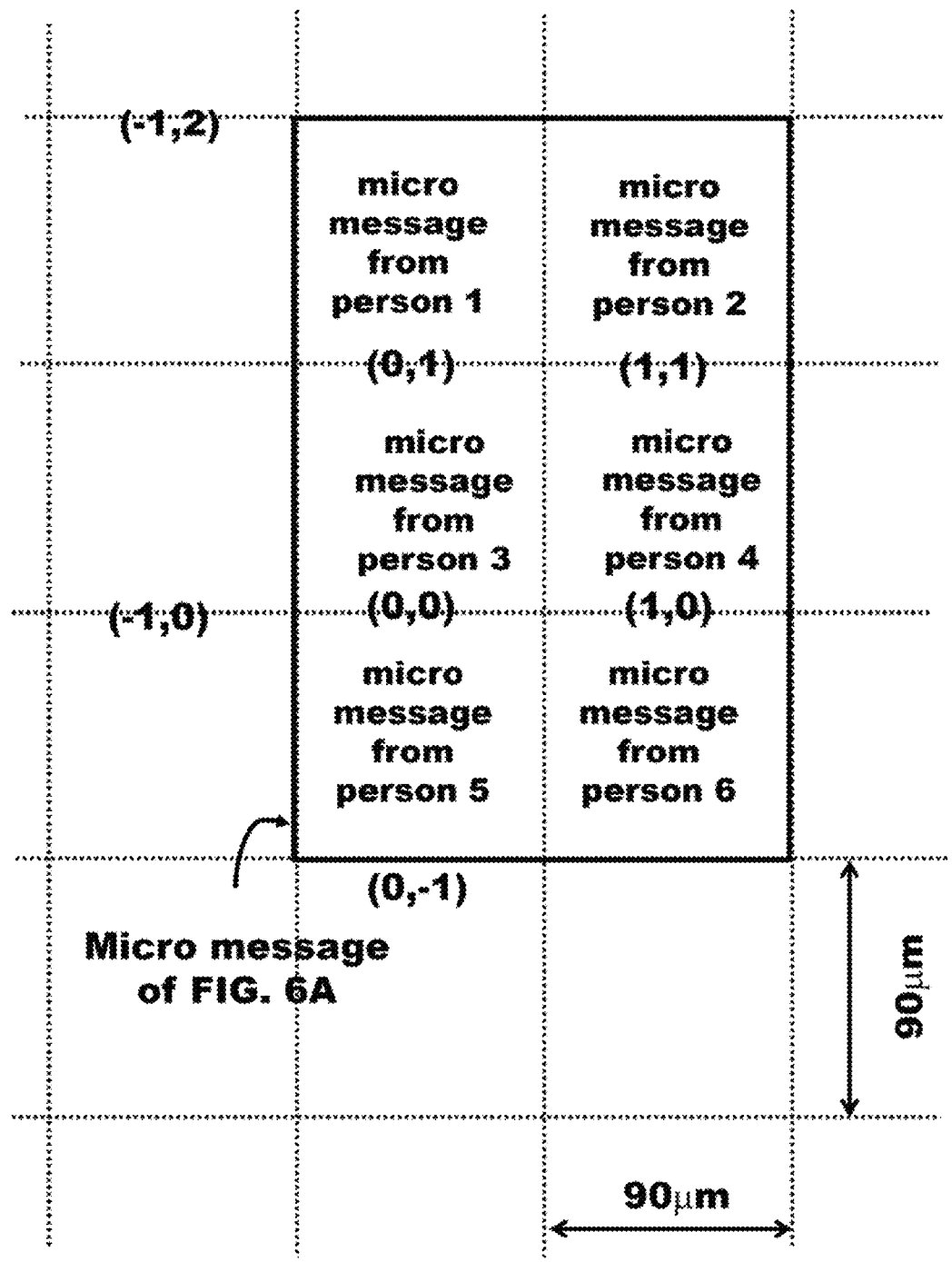
FIG. 7A illustrates the Cartesian coordinate location of the layout provided in FIG. 6A in accordance with the present invention.
Figure 7B:
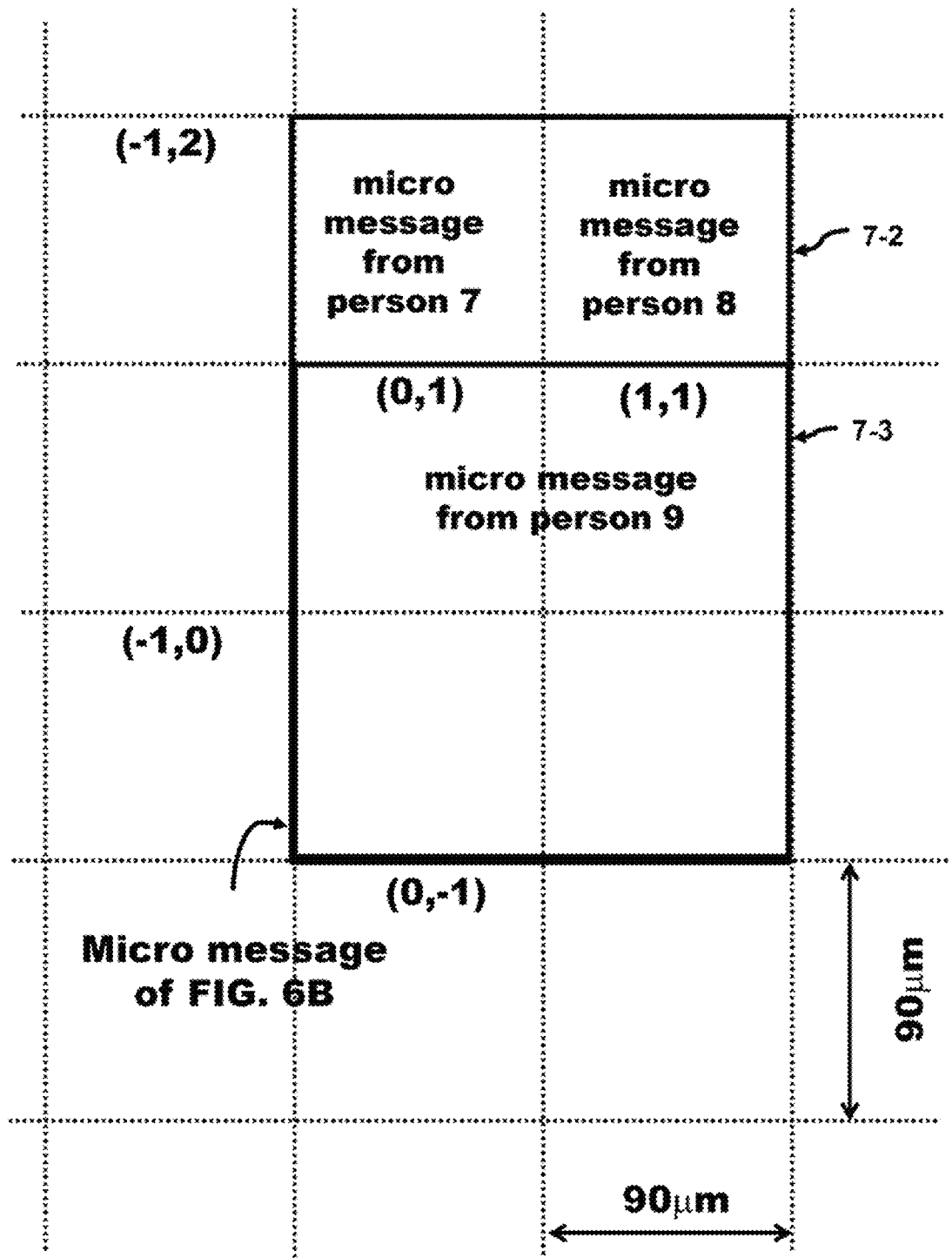
FIG. 7B presents the Cartesian coordinate location of the layout provided in FIG. 6B in one embodiment in accordance with the present invention.

FIG. 7A presents the micro message of FIG. 6A with the larger framework of the Cartesian coordinate system. FIG. 7B presents the micro message of FIG. 6B with the larger framework of the Cartesian coordinate system surrounding the area of the micro messages for persons 7, 8 and 9.

Figure 8:
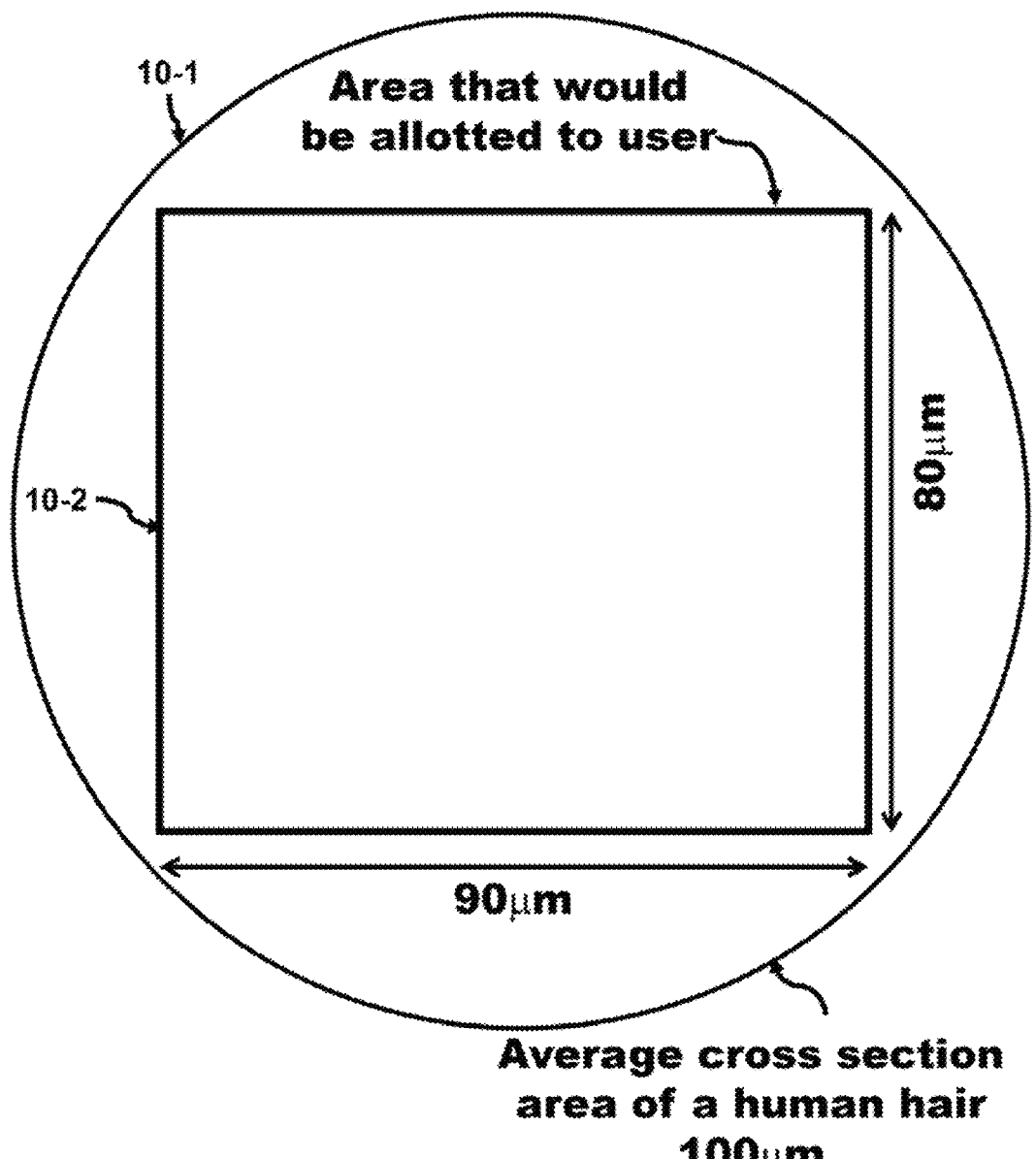
FIG. 8 presents a top view of a reserved space 90 by 80 microns against the cross-sectional area of a human hair in embodiment in accordance with the present invention.

FIG. 8 depicts a 90 um×80 um rectangular region 10-2 in comparison to a cross section of a human hair 10-1. The micro message of the person would be enclosed by the rectangular region 10-2. Each person's micro message should be contained within these boundaries presented in FIG. 8. The micro message would be formed from using the conductive metal levers as defined earlier.

The silicon technology that is used determines the minimum dimensions that can be formed on the silicon chip. For example, a 0.35 um CMOS technology corresponds to the minimum gate length of the P or N channel device having a channel length of 0.35 um. That is, the poly-silicon conductive traces would be 0.35 um wide. This is also called the gate length and would be 0.35 micrometer, in this case. A 40 nm CMOS technology would provide 40 nanometer channel length devices and conductive traces as small as 0.04 um. This latter channel length is a 10 times smaller. The smaller the channel length used in the technology, the greater the cost.

An optical microscope with a power of 1000× could be used to view the text of micro messages when the character height is of the order 10 um. The 40 nm technology would be able to create characters with a height of a half of a micrometer or less. An electron microscope would probably be required to view the sentences formed with characters having a height of half a micrometer. The character height can be adjusted to the type of microscope that will be used to view the micro message.

Figure 9A:
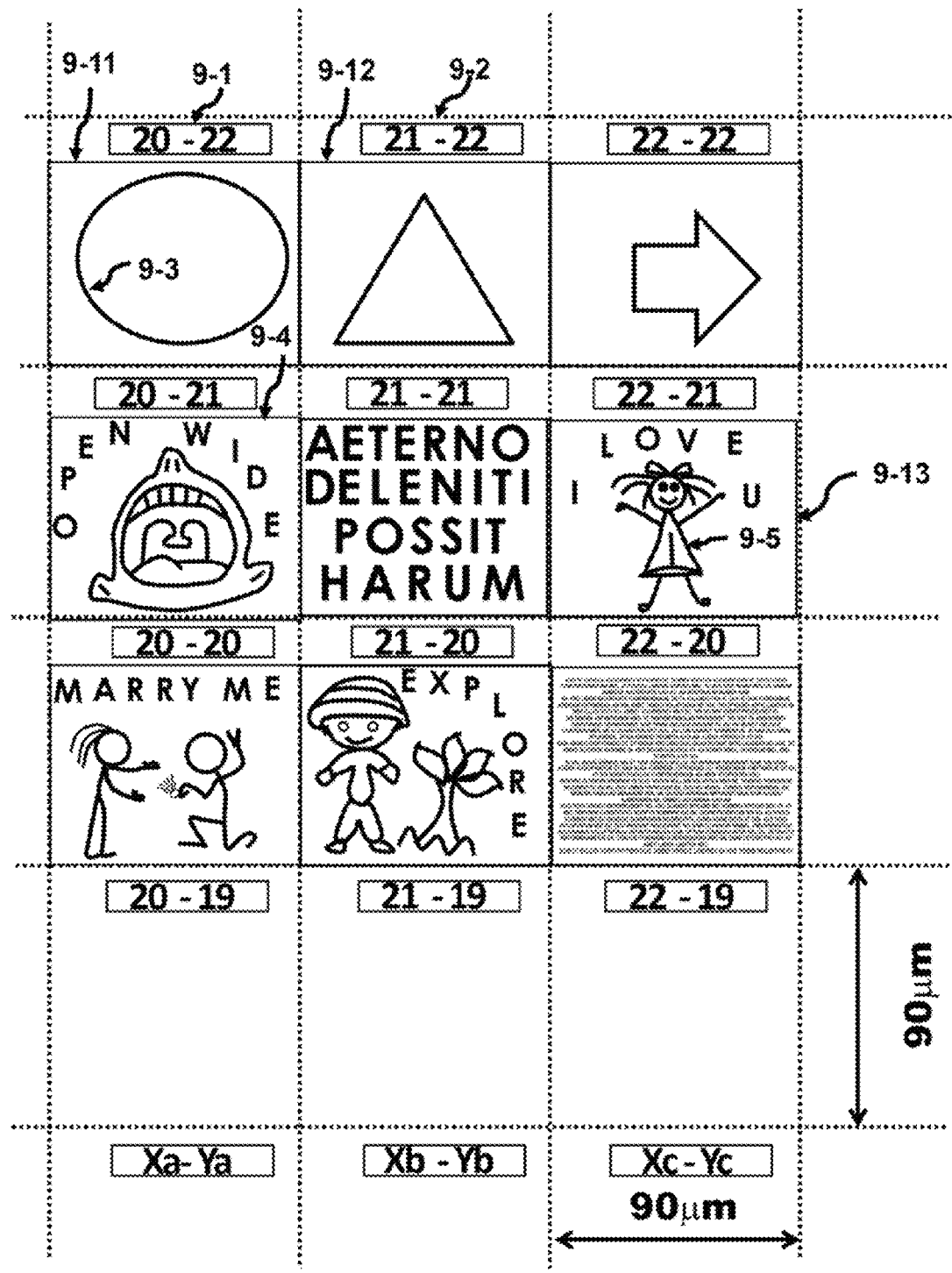
FIG. 9A illustrates a top view of an array of reserved spaces where some contain stick figures and text, text only, shapes, each identified by a Cartesian coordinate system in one embodiment in accordance with the present invention.

FIG. 9A illustrates some examples of micro-messages with the location of the rectangular areas define by the grid marks. Each rectangular area is 90 um×90 um where the top area sized 90 um×10 um holds the grid mark to provide the Cartesian coordinate so the micro message can be located under a microscope. Providing the grid mark on each and every micro message uses up area but provides an easy and convenient way to locate the micro message. An alternative would be to mark every other micro message with a grid mark or some other comparable spacing algorithm. The micro messages without the grid mark will have almost 10% more area to display their micro message. The size of the micro message being 80 um×90 um has been tailored to the use of reading the message with a 1000× microscope. The micro messages in FIG. 9A, for example, would be readable with this type of microscope.

Each rectangular area in FIG. 9A contains a person's micro message and the grid mark. A circular object 9-3 is enclosed within the rectangular area 9-11 located by the grid mark 20-22 9-1, a triangular object is enclosed in the rectangular area 9-12 located by the grid mark 21-22 9-2, an arrow within the area located by grid mark 22-22, an open mouth within the rectangular area 9-4 located by grid mark 20-21, text with a character height of about 15 um tall is positioned within the rectangular area located by grid mark 21-21, another stick FIG. 9-5 of a girl is enclosed in the rectangular area 9-13 located by grid mark 22-21, a marriage proposal is illustrated in the area located by grid mark 20-20, a stick figure of an explorer is provided in the area located by grid mark 21-20. Finally, text with characters about 1 um tall are used to compose micro message in the area located by grid mark 22-20. This message would be illegible with the 1000× microscope, but an electron microsphere with proper surface preparation would be able to read this micro message.

Figure 9B:
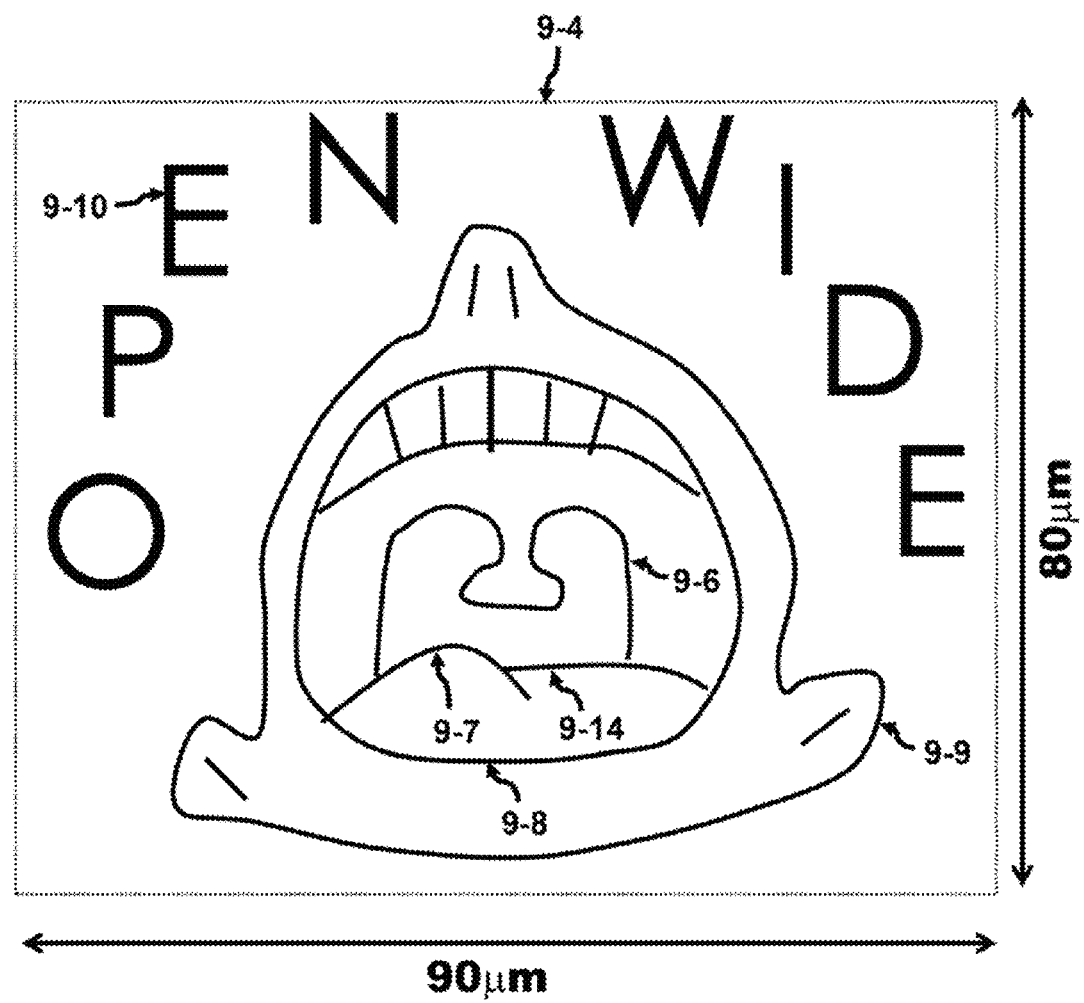
FIG. 9B illustrates a close up of one of the stick figures in one embodiment in accordance with the present invention.

FIG. 9B illustrates the micro message within the rectangle 9-4 magnified. The content of the micro message is contained with the borders defined by the rectangle 9-4. The letters are drawn using the conductive traces provided by one of the available metal levels. The stick figure is formed using a plurality of conductive traces. Part of the tongue is formed by conductive trace 9-7. The other part of the tongue is formed by conductive trace 9-14. The traces 9-7 and 9-14 can be ORed together connecting them where they join, or these two traces can be replaced by a single trace having the identical shape of the two traces 9-7 and 9-14. The uvula is formed by conductive trace 9-6. The open mouth is formed by conductive trace 9-8. The head outline is formed by conductive trace 9-9. These conductive traces cab be on the same metal level as discussed in FIG. 3B or on different metal levels as described in FIG. 3A. The conductive trace can be Boolean ORed in both cases. The trace widths can be varied, for example, from 1 to 10 um or more.

The micro message would be designed by the user. The user would use a tool to capture their design and the tool would then translate their design into a database. The database would be used by the mask designer to form the chromium masks. Masks are used in silicon technology processing to activate a photoresist. The photoresist patterns the micro message onto the surface of the silicon wafer after being exposed to electromagnetic radiation. Further processing steps are incorporated to define the conductive traces that is well known in the processing industry.

The stick figure can be drawn in one of the many open source computer aided design (CAD) tools. The generated output of these tools specifics the drawn traces and their width geometrically. This information can be scaled and applied to a second CAD layout tool that serves as the basis to generate the chromium masks that are used in the fabrication steps to form the metal layers during the processing steps applied to the silicon wafers in the fab lines that manufacture the silicon chips.

The size of the micro message of 90 um×80 um has a size that is large enough not to be visually seen with the unaided eye since it can be covered with a human hair, but not so small that a special microscope is required to see it. A simple low cost 1000× microscope can be used to see the micro message.

This combination of all micro messages reside on a chip smaller than the size a fingernail. The chip can be placed on a keychain without worry of damaging the micro message. This is achievable because the entire micro message is encapsulated in silicon dioxide. None of the metal is exposed to air, in addition, the metal segments are isolated from one another. For example, conductive trace 9-9 is not connected to conductive trace 9-9. These two conductive traces reside within the micro message forming the stick figure but do not connect to each other.

FIG. 10 illustrates different ways the relative brightness or tone can be adjusted by introducing opening into conductive polygons or by placing small pieces of conductive polygons having varying distances. FIG. 10A illustrates small polygons 10-1 tightly grouped in the upper left corner and dispersing in the lower right corner. The density of the opening increases as the upper left corner is approached. This will alter the brightness over area of the conductive polygons. This aspect can be used to generate an image with varying intensity levels.

FIG. 10B illustrates opening 10-2 in the conductive polygon 10-12. The density of the opening has the density of the conductive polygons in FIG. 10A. This will vary the brightness of different regions of the area of the conductive polygon 10-12. In FIG. 10C, a conductive polygon 10-6 can be placed behind the front conductive polygon 10-4 with regularly spaced opening 10-5. FIG. 10D depicts larger opening 10-7 and 10-8 which also have a background conductive trace 10-10 and 10-11 that partially obscures the opening 10-8 or extends over the entire opening 10-7, respectively.

These varying sizes of openings in conductive polygons or the small size of the conductive traces distributed in space can influence the brightness and intensity of the reflected light. This aspect can give the option of shading to help create a micro message of an image. Depending on the minimum sizes used of creating the openings or the pieces of conductive polygons, a picture or image could be produced by proper arrangement of these components. The micro message would then become a micro image within the family of micro messages. Software tools can be used to take an image and create the corresponding conductive polygons/ or absence of them, to form the same image within the rectangular area of 90 um×80 um making the image. This would probably be one of the smallest images ever made. The quality of the image would depend on the silicon technology (0.12 um, 40 nm, 20 nm, et.) chosen. The smaller the gate length, the finer the detail that can be achieved in producing the image. The image could be made so small that a scanning electron microscope (SEM) would be required to view it.

FIG. 11 illustrates different ways the relative tone can be adjusted by introducing polygon opening into a conductive layer or by placing small conductive polygons with varying sizes. FIG. 11A illustrates small conductive polygons 11-1 tightly grouped in the upper left corner. In the first and third quadrant the size of the conductive polygons 11-2 is increased, and in the second quadrant the conductive polygons 11-3 are larger yet. This will alter the brightness or tone over area of the conductive polygons. This concept can be used to generate an image with varying intensity levels.

Figure 11A:
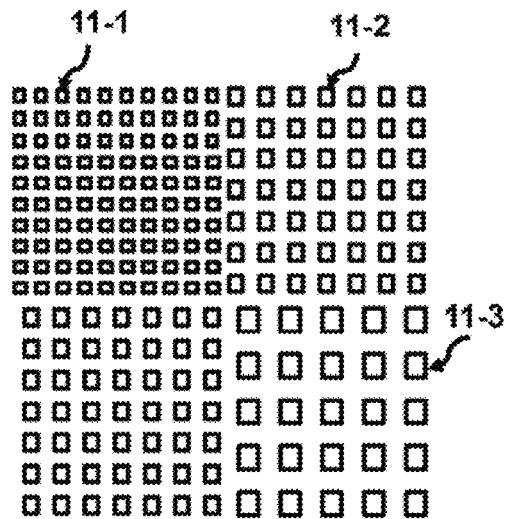
FIG. 11A presents a top view of conductive polygons that are positioned in distance over a gradient and with size variations at the block level in one embodiment in accordance with the present invention.
Figure 11B:
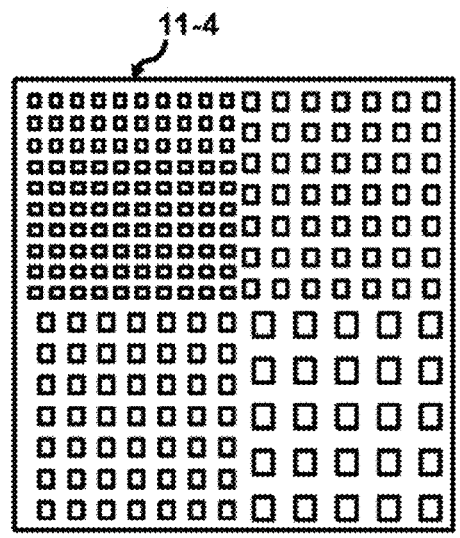
FIG. 11B shows a top view of a metal layer with small polygon opening that are positioned in distance over a gradient and with size variations at the block level altering the effective brightness, tone of the top surface from a distance in one embodiment in accordance with the present invention.

FIG. 11B illustrates polygon openings with the same distribution as the polygons in FIG. 11A in the conductive plate 11-4. The density of the opening has the density of the conductive polygons in FIG. 11A. This will vary the brightness of different regions of the area of the conductive plate 11-4.

Figure 11C:
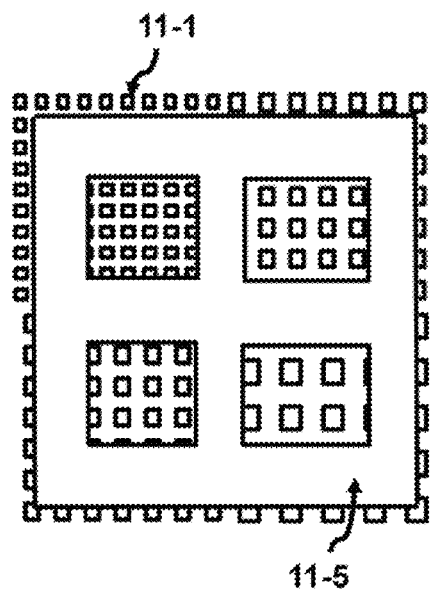
FIG. 11C presents a top view of a metal layer with small opening exposing small conductive polygons altering the effective brightness, tone of the top surface from a distance in one embodiment in accordance with the present invention.
Figure 11D:
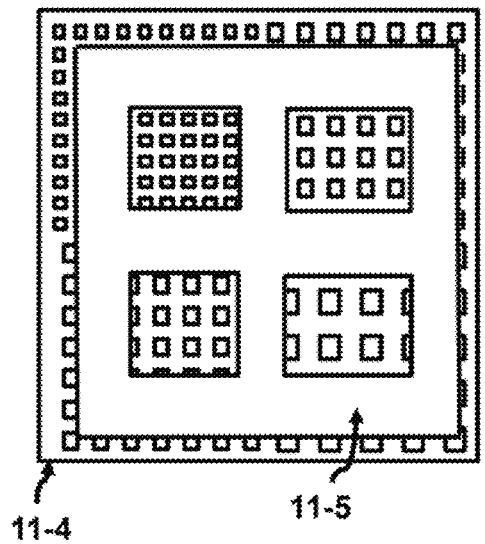
FIG. 11D presents a top view of a metal layer with small opening exposing different polygon opening in a surface layer underneath altering the effective brightness, tone of the top surface from a distance in one embodiment in accordance with the present invention

In FIG. 11C, an upper and lower metal layers are used. The conductive polygon distribution of FIG. 11A is formed on the lower metal layer. A conductive plate 11-S formed on an upper level with polygon opening. The opening allows a view of the small conductive polygons that are behind the conductive plate 11-S. FIG. 11D depicts a conductive plate 11-5 formed on an upper level with polygon opening. Below on a lower metal level, a conductive plate 11-4 having polygon openings with the same distribution as the polygons in FIG. 11A. These techniques can be used to adjust the brightness of different regions of the area of the conductive plate 11-5. The conductive plates and conductive polygons would be encapsulated in oxide.

Figure 12:
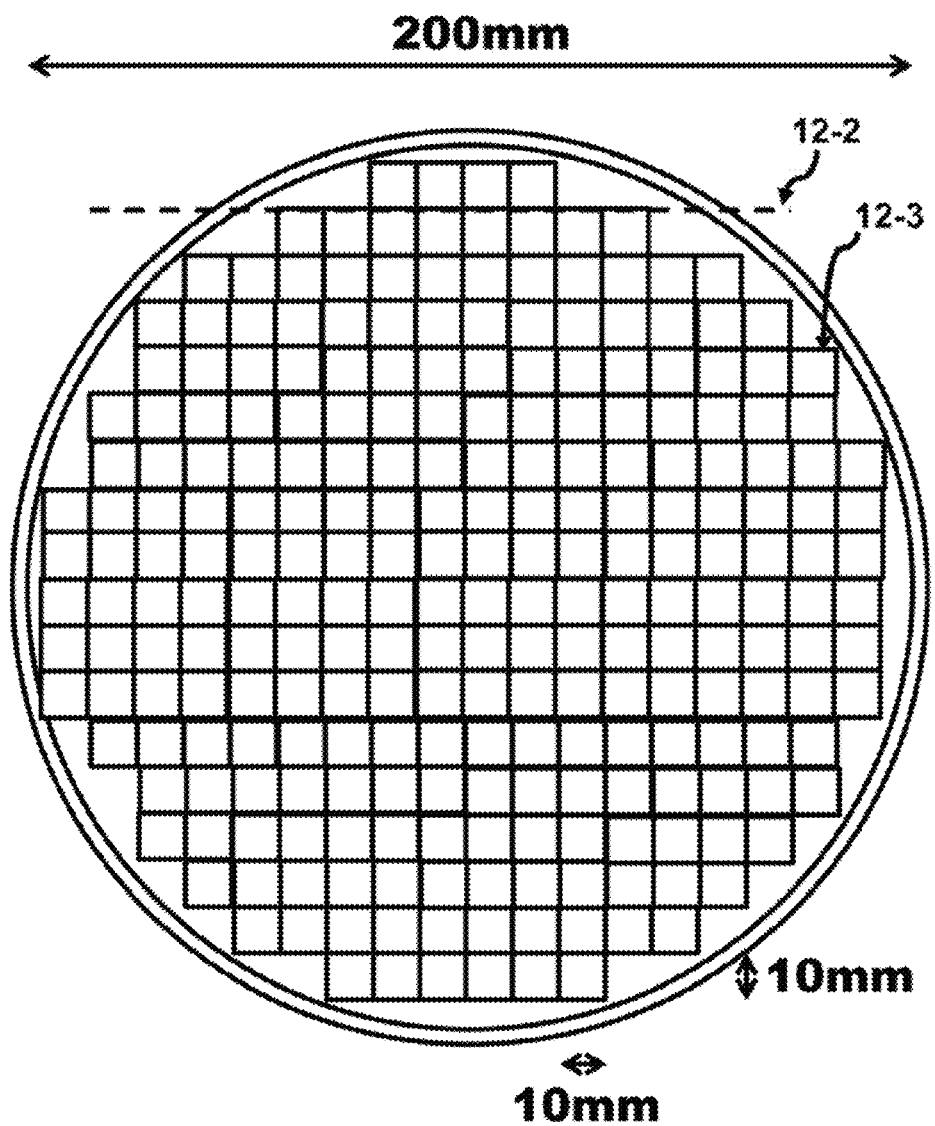
FIG. 12 presents a top view of a 200 mm wafer with a quantity of 248 1 cm×1 cm die (semiconductor chips) that can be cut apart along the saw lines in one embodiment in accordance with the present invention.

FIG. 12 illustrates the number of 10 mm×10 mm die 12-3 in a 200 mm diameter wafer 12-1. The dotted line 12-2 is a saw line where a saw would be used to cut apart the die 12-3 from each other. The die size in FIG. 12 is 10 mm×10 mm however the size of the die can have other length and width dimensions and can be chosen by the user based on the final image size the user desires. The lengths or widths can range from 1 mm to over 20 mm, for example, one semiconductor chip can be sized up to 22 mm×23 mm.

A larger die size allows a larger image to be formed; this larger image can be visually perceived by the unaided eye of the user easier. The image on a smaller die size may be more difficult to perceive where the user may need some form of magnification (magnifying glass, microscope, etc.) to see the image.

Figure 13A:
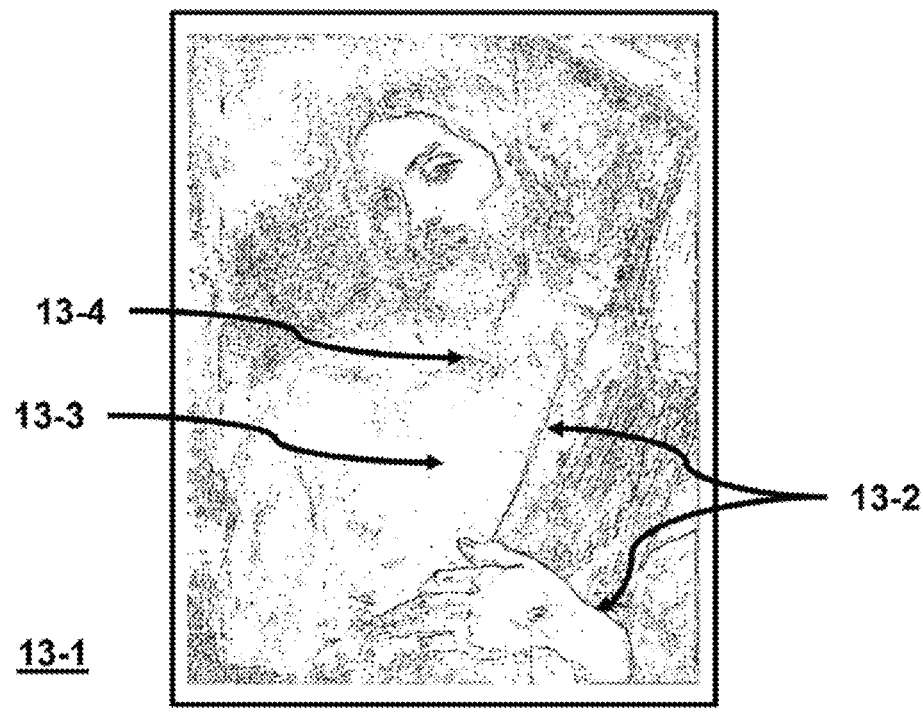
FIG. 13A shows an image using lines to define the image on a 5.4 mm×6.8 mm semiconductor chip in one embodiment in accordance with the present invention.

FIG. 13A presents an embodiment of an image 13-1 that presents the edges of the image being pronounced. Conductive traces can be used to define the image on a 5.4 mm×6.8 mm semiconductor chip in accordance with the present invention. The "white" area 13-3 is due to the placement of a plurality of conductive traces side by side without leaving any gaps. The "shaded" region 13-4 is due to the placement of a plurality of conductive traces and leaving gaps to reduce the brightness in this region. The "dark" line 13-2 portions correspond to the absence of conductive traces.

Figure 13B:
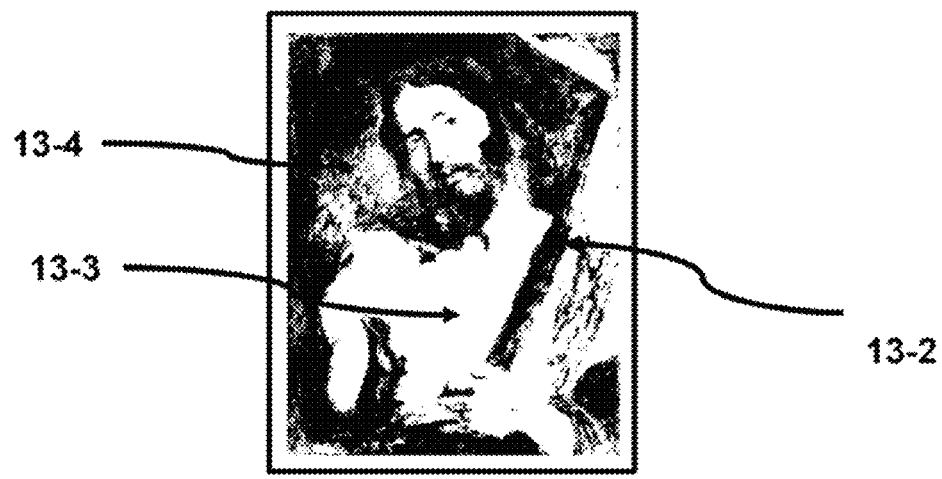
FIG. 13B depicts an image using tones (as in FIG. 10 or FIG. 11) to define the image on a 3.6 mm×4.5 mm semiconductor chip in one embodiment in accordance with the present invention.

FIG. 13B presents an embodiment of an image 13-5 that presents the brightness of the image being pronounced. Conductive traces in the form of polygons can be used to define the image on a 5.4 mm×6.8 mm semiconductor chip in accordance with the present invention. The "white" area 13-3 is due to the placement of a plurality of conductive polygons side by side without leaving any gaps. The "shaded" region 13-4 is due to the placement of a plurality of conductive polygons and leaving gaps between the conductive polygons to reduce the brightness in this region. The "dark" line 13-2 portions correspond to the absence of conductive polygons.

Basically, the bright regions of an image require a larger percentage of the area being covered by conductive traces or conductive polygons while the darker regions require a smaller percentage of the area being covered by conductive traces or conductive polygons. In this case, there are more conductive traces that correspond to the brightness of the image; this image is called the "positive" image. Note that the image can also be created as a "negative" image, that is, where there are more conductive traces that correspond to the darkness of the image, this image is called the "negative" image. Either "positive" or "negative" images can be used the desired image.

FIG. 14A depicts a stick figure of a cross 14-1 with text added below the cross. The outer box represents the chip size which in this case is a 4 mm×4 mm chip. For a negative image, the darker lines correspond to the placement of conductive traces or conductive polygons. However, the line of the cross can be generated by text as illustrated in FIG. 14B which presents a close up of the region 14-2 in FIG. 14A. The "line" of this portion of the cross is generated by at least one or more lines of text. The text when viewed from afar would blend in together to create a region that is reflective and would define the "line" of the cross to the unaided eye. Under magnification, of course, the text would become visible. FIG. 14C presents the region 14-3 of FIG. 14A. Here the "line" is represented by a solid conductive trace. The width of the trace can increased to increase the reflectiveness of this portion of the image.

Figure 15A:
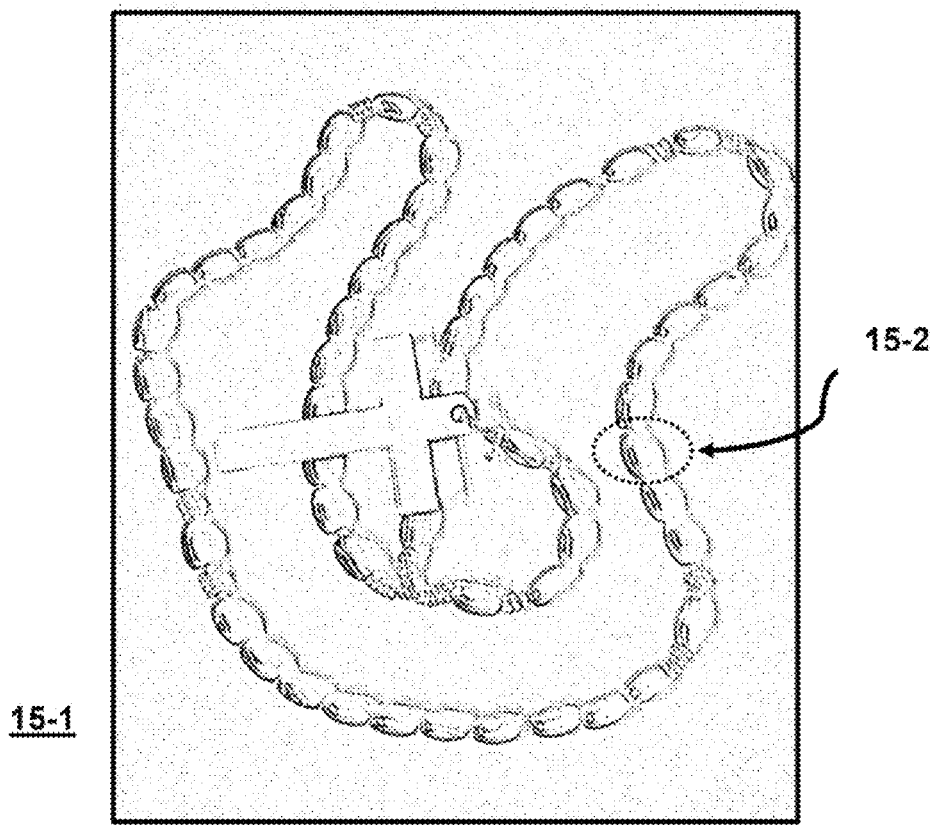
FIG. 15A depicts an image of a rosary formed from a combination of lines, tones, text, and stick figures on a 10 mm×12 mm semiconductor chip in one embodiment in accordance with the present invention.
Figure 15B:
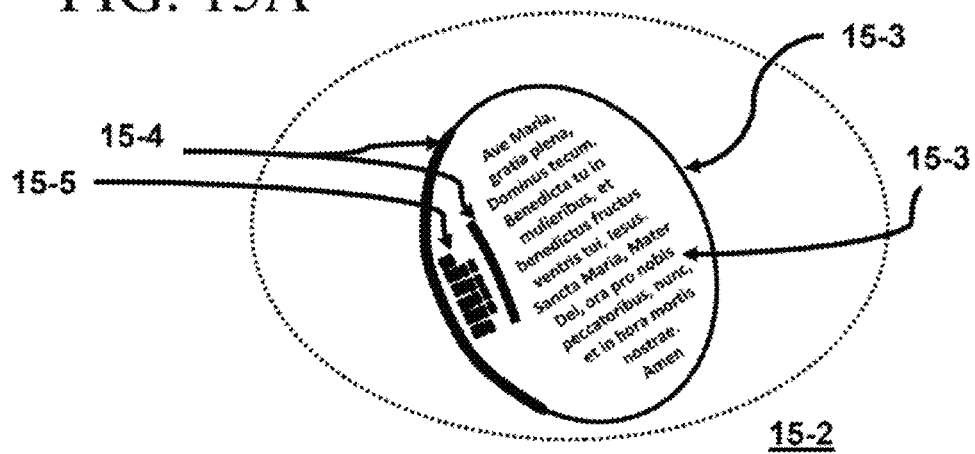
FIG. 15B presents a magnified view of a bead of FIG. 15A using a combination of at least a text (in Latin), stick figures formed from a conductive polygons, or conductive polygons that are positioned in distance over a gradient in one embodiment in accordance with the present invention.

FIG. 15A depicts an image of a rosary 15-1 formed on the surface of a silicon chip from a combination of lines, tones, text, and stick figures on a 10 mm×12 mm semiconductor chip in one embodiment in accordance with the present invention. The region 15-2 represents a bead and is increased in magnification and presented in FIG. 15B. This image is also a "negative" image where dark regions correspond to the presence of conductive traces. The lighter brightness regions of the bead is represented by the text 15-3 of the Hail Mary presented in Latin. An even brighter region of the bead is generated by the closely spaced polygons 15-5. Conductive traces 15-3 and 15-4 are used to outline the bead 15-3, depicts a brighter region of the bead 15-4 inside the bead, and increase a portion of the bead defining outer region 15-4 where the conductive trace in increased in width. When the semiconductor chip 15-1 being a large chip 1 cm×1.2 cm is viewed with the unaided eye, the rosary will be visible with the unaided eye. However, the finer details of the text 15-3 and closely spaced conductive polygons may require the use of a magnification device such as a magnifying glass or microscope to clearly see the detail. If desired, the image can be generate as a "positive" image as described earlier.

Figure 16A:
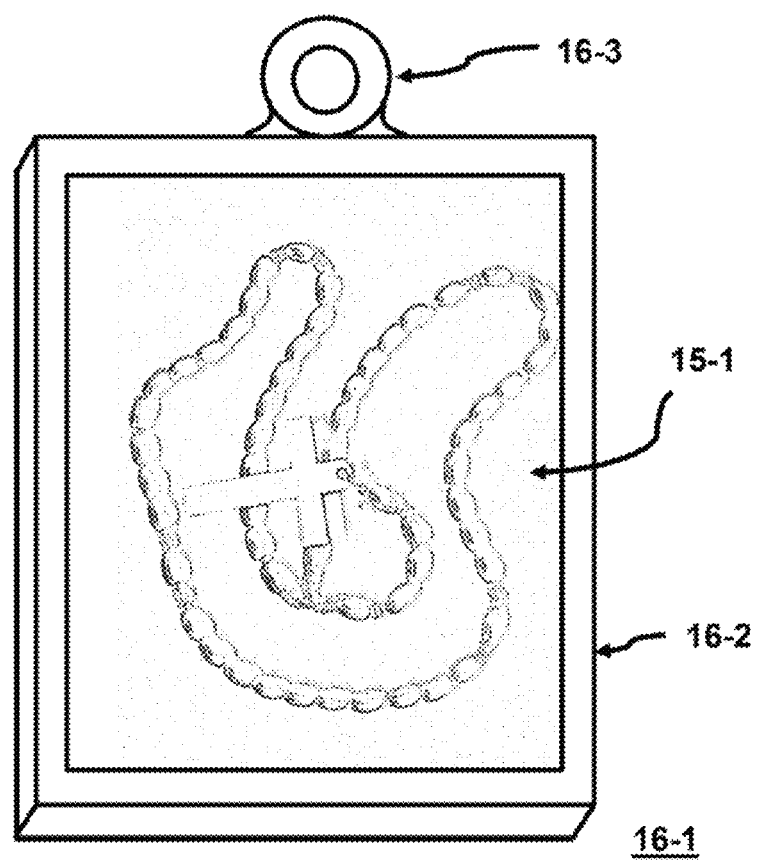
FIG. 16A presents a pendant of the semiconductor chip of FIG. 15A enclosed in a bezel with a ring soldered to the bezel in one embodiment in accordance with the present invention.
Figure 16B:
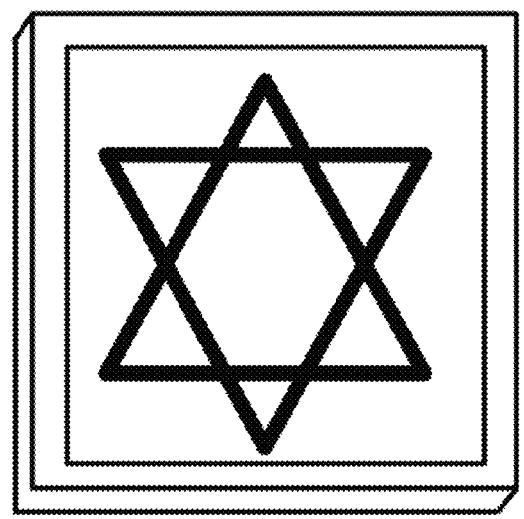
FIG. 16B presents a pendant of a semiconductor chip with a star of David enclosed in a bezel in one embodiment in accordance with the present invention.

FIG. 16A illustrates a pendant 16-1 holding the semiconductor chip 15-1 of FIG. 15A which is enclosed in a bezel 16-2 with a ring 16-3 soldered to the bezel in one embodiment in accordance with the present invention. The overall dimensions of the pendant would be about 12 mm×14 mm with a height of about 1 mm and would be a fine piece of jewelry for a necklace or pin. The bezel 16-2 material can be made of silver or a metal plated with gold to create a precious metal piece of jewelry. FIG. 16B illustrates a pendant of a semiconductor chip with a Star of David enclosed in a bezel in one embodiment in accordance with the present invention.

Finally, it is understood that the above description is only illustrative of the principles of the current invention. It is understood that the various embodiments of the invention, although different, are not mutually exclusive. In accordance with these principles, those skilled in the art may devise numerous modifications without departing from the spirit and scope of the invention. The polygons can be distributed in a continuous gradient over the surface area of the silicon semiconductor to emulate an image more accurately. The finer the size of the polygons will allow better control of the accuracy of the image when viewed from a distance. Once the individual polygons appear to merge together by the eye, the image is perceived. A reserved area is the surface silicon area allotted to forming the micro message. The layers of oxide and metal layers that are vertically formed over the reserved area of the silicon surface area create a volume. The micro message is contained within the volume of the reserved space of a user so that the user's micro message of the various metal layers are isolated from the various metal layers of the micro message within the volume of an adjacent reserved space being used by another user. A single chip can hold a plurality of micro messages where in most cases the layers of the conductive traces of the micro message are isolated from the corresponding layers of the conductive traces of the other micro messages. A definition of isolated is when, the conductive traces (for example, M5, M4, M3, M2, and M, poly silicon layers although more or less metal layers can be used in a process) forming the micro message (whether it is text, a stick figure, an image, or any combination of these) in the volume of one reserved area are separated by oxide from the corresponding conductive traces (of the M5, M4, M3, M2, and M1 poly silicon layers) in the volume of an adjacent reserved space. Thus, the M5 layer in a first reserved space does not directly connect to the M5 layer in an adjacent reserved space with a M5 conductive trace crossing the vertical cross sectional area separating the volume contained over the first reserved space from that of the volume contained over the adjacent reserved space. Another condition of a single chip holding a plurality of micro messages where in some cases the layers of the conductive traces of the micro message may be connected (laterally or by vias) to the corresponding layers of the conductive traces of the other micro messages is that these connected conductive traces between different micro messages do not carry current continuously. The entire connected trace, in this case, is either completely insulated being surrounded by an oxide or may be connected to a potential voltage source, such as ground. Thus, the entire connected conductive trace is either floating or connected to a common node; therefore current would not flow continuously in the conductive trace. A P+ substrate through the P-tub or the N-tub are some examples of a common node. For example, the P+ substrate is an electrical node that can be common to all micro messages, so the P+ substrate is a common node. An N-tub can be a common electrical node that can be common to some or all of the micro messages. Even within one micro message, any connected conductive trace within a micro message is either floating or connected to a common node. For example, vias can be used to connect the top conductive layer and all intermediate conductive layers to the lowest conductive layer. The lowest conductive layer can then be connected to the one of the tub ties (a common node) by a via. This entire conductive trace would not have current flowing continuously. These micro messages with images could be portraits, landscapes, etc. These chips can be incorporated into jewelry: key chains, watches, necklaces, etc. since they have a beauty factor when viewed with the naked eye due to interference patterns, besides providing a micro message.

Religious symbols, such as Christian symbols, images, prayers or quotes can be being placed on a semiconductor chip, while other symbols, images, quotes, or prayers of other religious denominations such as Jewish, Hindu, etc., for example, can also be used. Any portion of published literature or works, statements or quotes of famous people, lyrics from musical recordings, artwork (like the Mona Lisa, etc.), can be placed on semiconductor chips. Images from cameras, images stored in memory, or any source of photography can serve as a basis for an image. The image is formed on a semiconductor chip by combining conductive polygons or conductive lines where these polygons and lines are used to form stick figures, text, tonal variations of the image due to placement and separation of conductive polygons, or the inclusion of other smaller images, that is, the image can be composed of a number of smaller images. Each of the smaller images is formed by combining conductive polygons or conductive lines with reduced sized dimensions. For example, the reduced sized dimension of each polygon can be sized equal to or greater than a minimum sub-micron sized feature of the processing technology currently being used. Essentially most if not all of the conductive polygons or conductive lines formed in the oxide layer of the semiconductor chip are used to generate the visible image on the surface of the semiconductor chip. These conductive polygons or conductive lines are either electrically isolated from one another or part of an open circuit. The conductive lines are formed from conductive traces, the conductive lines can be shaped to form straight lines, curves, letters, shading (by placing lines adjacent to each other or increasing the width of the conductive line), stick figures, and polygons. The image is being implemented within the oxide layer above the substrate of a semiconductor chip. The image can be perceived by a user as a recognizable image when the naked eye views the top surface of the semiconductor chip. The semiconductor chip can range in size of length and width, being either rectangular or square, with lengths or widths ranging from about 1 mm to over 20 mm, for example, one semiconductor chip can be sized up to 22 mm×23 mm. A chip sized as little as 2 mm×2 mm could hold a single letter of the alphabet and could be seen with the unaided eye. These chips would be fabricated on a wafer in a semiconductor fab where one or more wafer lots of can be processed. A wafer lot typically has 25 wafers. The wafers can be sized from 100 mm to 450 mm in diameter. A 6" wafer (~150 mm) lot with 25 wafers would produce about 6,200 1 cm×1 cm chips. Depending on the reticle size which prints the photoresist on the wafers, there could be 4 different 1 cm×1 cm chips on the same wafer which hold different images. For instance, a Mona Lisa, Scary Night, a rosary, Jesus's image.

The different layers of metal in the fabricated chip can be stacked and offset from one another to provide an interference (pattern) between the reflected light from the different layers of metal to offer a coloring aspect to the image. Interference usually refers to the interaction of light waves with each other, in this case, the light is reflected from the different metal layers. The distance between the metal layers can cause the light wave to reinforce or annihilate part of the light waves. The light waves can have a range of frequencies where the interference between the light waves can generate colors. This interference of light waves over the range of frequencies can be used to give color to the image.

These varying sizes of openings in conductive polygons or the small size of the conductive traces distributed in space can influence the brightness and intensity of the reflected light. The conductive polygons reflect light and will appear to be brighter against the background of the regions where the conductive polygons are missing exposing the substrate of the chip.

Another embodiment relates to a semiconductor chip consisting essentially of: an image, the image possessing a gradient of tones defining the image; and a plurality of conductive traces formed in the semiconductor chip configured to define the image, the plurality of conductive traces are completely encapsulated in oxide within an oxide layer, wherein the plurality of conductive traces in the oxide layer are each positioned over a top surface area of a substrate of the semiconductor chip to match the gradient of tones defining the image, the plurality of conductive traces when viewed at a distance from the top surface area of the semiconductor chip forms the image, wherein the image is visualized and perceived by a naked eye of a user at the distance from the top surface area of the semiconductor chip where the plurality of conductive traces blend into the gradient of tones of the image and merge together to form the image, wherein the gradient of tones of the image is adjusted by varying a spacing between the placement of the plurality of conductive traces within the oxide layer of the semiconductor chip, wherein the top surface area of the semiconductor chip is greater than 4 $mm^2$. The semiconductor chip wherein the image is comprised of the plurality of conductive traces, the plurality of conductive traces are formed by lines, tones, text, or stick figures, or the combination of two or more of these components, wherein the conductive traces are formed from poly-silicon, aluminum, or copper, the conductive traces of aluminum and copper placed in any one of a plurality of metal layers, wherein at least one conductive trace is shaped as a line or a polygon, the polygon can have a variety of shapes, wherein the shapes comprise triangles, quadrilaterals, pentagons, hexagons, heptagons, or octagons, wherein the triangles further comprise equilateral, isosceles, obtuse, acute, or scalene triangles, and wherein the quadrilaterals further comprise rectangles, rhombi, trapezoids, or squares, wherein the image comprises a plurality of smaller sized images where at least one of the smaller sized image is not perceived by a naked eye of a user without the aid of a magnification device.

Another embodiment relates to a semiconductor chip consisting essentially of a plurality of conductive traces formed in the semiconductor chip, each of the plurality of conductive traces are configured to remain a part of an open circuit, the open circuit preventing a continuous current flow from occurring within the open circuit, wherein the plurality of conductive traces are positioned over a surface area of a substrate of the semiconductor chip to match a gradient of tones that defines an image, the positioned conductive traces when viewed together at a distance from the top surface area of the semiconductor chip produce the image, wherein the image is visualized and perceived by a naked eye where the plurality of conductive traces blend into the gradient of tones of the image and merge together to form the image, wherein the gradient of tones of the image is adjusted by varying a spacing between the placement of the plurality of conductive traces within the oxide layer of the semiconductor chip, wherein the top surface area of the semiconductor chip is greater than 4 $mm^2$. The semiconductor chip wherein the image is comprised of the plurality of conductive traces, the plurality of conductive traces are formed by lines, tones, text, or stick figures, or the combination of two or more of these components, wherein the conductive traces are formed from N-tub, P-tub, heavily doped silicon, poly-silicon, aluminum, or copper, the conductive traces of aluminum and copper placed in any one of a plurality of metal layers, wherein at least one conductive trace is shaped as a line or a polygon, the polygon can have a variety of shapes, wherein the shapes comprise triangles, quadrilaterals, pentagons, hexagons, heptagons, or octagons, wherein the triangles further comprise equilateral, isosceles, obtuse, acute, or scalene triangles, and wherein the quadrilaterals further comprise rectangles, rhombi, trapezoids, or squares, wherein the image comprises a plurality of smaller sized images where at least one of the smaller sized image is not perceived by a naked eye of a user without the aid of a magnification device.

Another embodiment relates to a method of forming at least one image visible from a top surface of a semiconductor chip, the at least one image comprising a plurality of conductive traces formed in the semiconductor chip, the plurality of conductive traces visualized and perceived as the at least one image by a naked eye when viewed at a distance from the top surface of the semiconductor chip comprising the steps of: encapsulating the plurality of conductive traces completely in oxide within an oxide layer, wherein the plurality of conductive traces placed within an oxide layer are each positioned over a top surface area of a substrate of the semiconductor chip to match the gradient of tones defining the at least one image, the positioned conductive traces when viewed together at a distance from the top surface area of the semiconductor chip produce the at least one image, wherein the at least one image is visualized and perceived by a naked eye where the plurality of conductive traces blend into the gradient of tones of the image and merge together to form the at least one image, wherein the gradient of tones of the at least one image is adjusted by varying a spacing between the placement of the plurality of conductive traces within the oxide layer of the semiconductor chip, wherein the top surface area of the semiconductor chip is greater than 4 mm$^2$. The method wherein the at least one image is comprised of the plurality of conductive traces, the plurality of conductive traces are formed by lines, tones, text, or stick figures, or the combination of two or more of these components, wherein at least one of the conductive traces in the plurality of conductive traces is electrically connected to another conductive trace in the plurality of conductive traces, wherein the conductive traces are formed from poly-silicon, aluminum, or copper, the conductive traces of aluminum and copper formed in any one of a plurality of metal layers, wherein at least one conductive trace is shaped as a line or a polygon, the polygon can have a variety of shapes, wherein the shapes comprise triangles, quadrilaterals, pentagons, hexagons, heptagons, or octagons, wherein the triangles further comprise equilateral, isosceles, obtuse, acute, or scalene triangles, and wherein the quadrilaterals further comprise rectangles, rhombi, trapezoids, or squares. The lowest conductive layer can then be connected to the one of the tub ties (a common node) by a via, as mentioned earlier. Any conductive layer can be connected to one of the tub ties by a sequence of vias; (for a 5 metal layer chip, although metal layers in chips can be more or less than 5 layers) M5 via to M4, M4 via to M3, M3 via to M2, M2 via to M1, M1 via to tub tie, or M5 via to M4, M4 via to M3, M3 via to M2, M2 via to M1, M1 via to poly, poly via to tub tie. The tub tie then connects to the tub. The conductive layer besides being connected to at least one of the tub ties (to either the n-tub tie or to the p-tub tie), the conductive layer can also be connected to both tub ties simultaneously (to both the n-tub and to the p-tub simultaneously). A diode is formed between the n-tub and the p-tub within the substrate as is well known in the art. The conductive layer, in this case, when connected to both tub ties simultaneously shorts the diode that is formed between the n-tub and the p-tub. Because the diode is shorted at its anode and cathode terminals by the conductive layer, continuous current would not flow in this diode or the closed circuit of the diode and the conductive layer.

What is claimed is:

1. A method of forming at least one image visible from a top surface of a semiconductor chip, the at least one image comprising a plurality of conductive traces formed in the semiconductor chip, the plurality of conductive traces visualized and perceived as the at least one image by a naked eye when viewed at a distance from the top surface of the semiconductor chip comprising the step of encapsulating the plurality of conductive traces completely in oxide within an oxide layer, wherein the plurality of conductive traces placed within an oxide layer are each positioned over a top surface area of a substrate of the semiconductor chip to match the gradient of tones defining the at least one image, the positioned conductive traces when viewed together at a distance from the top surface area of the semiconductor chip produce the at least one image.

2. The method of claim 1, wherein
the at least one image is comprised of the plurality of conductive traces, the plurality of conductive traces are formed by lines, tones, text, or stick figures, or the combination of two or more of these components.

3. The method of claim 1, wherein
at least one of the conductive traces in the plurality of conductive traces is electrically connected to another conductive trace in the plurality of conductive traces, wherein the conductive traces are formed from poly-silicon, aluminum, or copper, the conductive traces of aluminum and copper formed in any one of a plurality of metal layers.

4. The method of claim 1, wherein
at least one conductive trace is shaped as a line or a polygon, the polygon can have a variety of shapes, wherein the shapes comprise triangles, quadrilaterals, pentagons, hexagons, heptagons, or octagons, wherein the triangles further comprise equilateral, isosceles, obtuse, acute, or scalene triangles, and wherein the quadrilaterals further comprise rectangles, rhombi, trapezoids, or squares.

5. The method of claim 1, wherein
the at least one image is visualized and perceived by a naked eye where the plurality of conductive traces blend into the gradient of tones of the image and merge together to form the at least one image.

6. The method of claim 5, wherein
the gradient of tones of the at least one image is adjusted by varying a spacing between the placement of the plurality of conductive traces within the oxide layer of the semiconductor chip, wherein the top surface area of the semiconductor chip is greater than 4 mm$^2$.

7. A semiconductor chip consisting essentially of:
a plurality of conductive traces formed in the semiconductor chip, each of the plurality of conductive traces are configured to remain a part of an open circuit, the open circuit preventing a continuous current flow from occurring within the open circuit, wherein the plurality of conductive traces are positioned over a surface area of a substrate of the semiconductor chip to match a gradient of tones that defines an image, the positioned conductive traces when viewed together at a distance from the top surface area of the semiconductor chip produce the image.

8. The semiconductor chip of claim 7, wherein the image is comprised of the plurality of conductive traces, the plurality of conductive traces are formed by lines, tones, text, or stick figures, or the combination of two or more of these components.

9. The semiconductor chip of claim 7, wherein the conductive traces are formed from N-tub, P-tub, heavily doped silicon, poly-silicon, aluminum, or copper, the conductive traces of aluminum and copper placed in any one of a plurality of metal layers.

10. The semiconductor chip of claim 7, wherein at least one conductive trace is shaped as a line or a polygon, the polygon can have a variety of shapes, wherein the shapes comprise triangles, quadrilaterals, pentagons, hexagons, heptagons, or octagons, wherein the triangles further comprise equilateral, isosceles, obtuse, acute, or scalene triangles, and wherein the quadrilaterals further comprise rectangles, rhombi, trapezoids, or squares.

11. The semiconductor chip of claim 7, wherein the image comprises a plurality of smaller sized images where at least one of the smaller sized image is not perceived by a naked eye of a user without the aid of a magnification device.

12. The semiconductor chip of claim 7, wherein the image is visualized and perceived by a naked eye where the plurality of conductive traces blend into the gradient of tones of the image and merge together to form the image.

13. The semiconductor chip of claim 12, wherein the gradient of tones of the image is adjusted by varying a spacing between the placement of the plurality of conductive traces within the oxide layer of the semiconductor chip, wherein the top surface area of the semiconductor chip is greater than 4 mm$^2$.

14. A semiconductor chip consisting essentially of:
an image, the image possessing a gradient of tones defining the image; and
a plurality of conductive traces formed in the semiconductor chip configured to define the image,
the plurality of conductive traces are completely encapsulated in oxide within an oxide layer,
wherein the plurality of conductive traces in the oxide layer are each positioned over a top surface area of a substrate of the semiconductor chip to match the gradient of tones defining the image, the plurality of conductive traces when viewed at a distance from the top surface area of the semiconductor chip forms the image.

15. The semiconductor chip of claim 14, wherein the image is comprised of the plurality of conductive traces, the plurality of conductive traces are formed by lines, tones, text, or stick figures, or the combination of two or more of these components.

16. The semiconductor chip of claim 14, wherein the conductive traces are formed from poly-silicon, aluminum, or copper, the conductive traces of aluminum and copper placed in any one of a plurality of metal layers.

17. The semiconductor chip of claim 14, wherein at least one conductive trace is shaped as a line or a polygon, the polygon can have a variety of shapes, wherein the shapes comprise triangles, quadrilaterals, pentagons, hexagons, heptagons, or octagons, wherein the triangles further comprise equilateral, isosceles, obtuse, acute, or scalene triangles, and wherein the quadrilaterals further comprise rectangles, rhombi, trapezoids, or squares.

18. The semiconductor chip of claim 14, wherein the image comprises a plurality of smaller sized images where at least one of the smaller sized image is not perceived by a naked eye of a user without the aid of a magnification device.

19. The semiconductor chip of claim 14, wherein the image is visualized and perceived by a naked eye of a user at the distance from the top surface area of the semiconductor chip where the plurality of conductive traces blend into the gradient of tones of the image and merge together to form the image.

20. The semiconductor chip of claim 19, wherein the gradient of tones of the image is adjusted by varying a spacing between the placement of the plurality of conductive traces within the oxide layer of the semiconductor chip, wherein the top surface area of the semiconductor chip is greater than 4 mm$^2$.

* * * * *